(12) United States Patent
Yang et al.

(10) Patent No.: US 12,112,824 B2
(45) Date of Patent: Oct. 8, 2024

(54) SENSE AMPLIFIER CIRCUIT AND DATA READ METHOD

(71) Applicant: CHANGXIN MEMORY TECHNOLOGIES, INC., Hefei (CN)

(72) Inventors: Guifen Yang, Hefei (CN); Sungsoo Chi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 172 days.

(21) Appl. No.: 18/149,675

(22) Filed: Jan. 4, 2023

(65) Prior Publication Data
US 2023/0162762 A1 May 25, 2023

Related U.S. Application Data

(63) Continuation of application No. PCT/CN2022/107640, filed on Jul. 25, 2022.

(30) Foreign Application Priority Data

Nov. 24, 2021 (CN) .......................... 202111405425.7

(51) Int. Cl.
*G11C 7/06* (2006.01)
*G11C 7/10* (2006.01)
*G11C 7/12* (2006.01)

(52) U.S. Cl.
CPC ............ *G11C 7/067* (2013.01); *G11C 7/1096* (2013.01); *G11C 7/12* (2013.01)

(58) Field of Classification Search
CPC ......... G11C 7/067; G11C 7/1096; G11C 7/12; G11C 11/4091; G11C 7/065; G11C 11/4094

USPC ..................................................... 365/185.21
See application file for complete search history.

(56) References Cited

U.S. PATENT DOCUMENTS

| 10,535,388 | B1 | 1/2020 | Ingalls |
| 11,887,655 | B2* | 1/2024 | Lu ....................... G11C 11/4091 |
| 2016/0012868 | A1* | 1/2016 | Moon .................... G11C 7/065 |
| | | | 365/189.11 |

(Continued)

FOREIGN PATENT DOCUMENTS

| CN | 104575569 A | 4/2015 |
| CN | 112767975 A | 5/2021 |
| CN | 112863561 A | 5/2021 |

*Primary Examiner* — Fernando Hidalgo
(74) *Attorney, Agent, or Firm* — Kilpatrick Townsend & Stockton LLP

(57) ABSTRACT

Embodiments relate to a sense amplifier circuit and a data read method. The sense amplifier circuit includes: a first P-type transistor connected to a first signal terminal; a second P-type transistor connected to a second signal terminal; a first N-type transistor connected to a third signal terminal; a second N-type transistor connected to a fourth signal terminal; a first offset cancellation subcircuit configured to connect a first read bit line to a second complementary read bit line in response to a first offset cancellation signal; a second offset cancellation subcircuit configured to connect a first complementary read bit line to a second read bit line in response to a second offset cancellation signal; a first write-back subcircuit configured to connect the first complementary read bit line to the second complementary read bit line in response to a first write-back signal; and a second write-back subcircuit.

16 Claims, 37 Drawing Sheets

(56) References Cited

U.S. PATENT DOCUMENTS

| | | | |
|---|---|---|---|
| 2019/0147925 A1* | 5/2019 | Choi | G11C 11/4094 365/203 |
| 2020/0075065 A1* | 3/2020 | Jeong | H03F 1/0205 |
| 2022/0028436 A1* | 1/2022 | Lu | G11C 7/065 |
| 2023/0036684 A1* | 2/2023 | Jung | G11C 11/4094 |

* cited by examiner

SENSE AMPLIFIER CIRCUIT AND DATA READ METHOD

CROSS-REFERENCE TO RELATED APPLICATION

The present disclosure is a continuation of PCT/CN2022/107640, filed on Jul. 25, 2022, which claims priority to Chinese Patent Application No. 2021114054257 titled "SENSE AMPLIFIER CIRCUIT AND DATA READ METHOD" and filed to the State Patent Intellectual Property Office on Nov. 24, 2021, the entire contents of which are incorporated herein by reference.

TECHNICAL FIELD

The present disclosure relates to the field of integrated circuit technology, and more particularly, to a sense amplifier circuit and a data read method.

BACKGROUND

When performing a read operation on a memory cell of a memory device, a voltage difference between a bit line and a complementary bit line is generally read out and amplified by means of a sense amplifier. The sense amplifier generally constitutes a latch amplifier circuit structure by means of two N-type transistors and two P-type transistors, to amplify signals on the bit line and the complementary bit line connected to two ends of the sense amplifier. However, the N-type transistors and the P-type transistors formed under current process conditions typically have differences in turn-on capabilities, which may result in read failures.

In related technologies, there is a method of performing offset cancellation on each transistor before turning on a word line and reading data in a memory cell, thereby preventing read errors. However, the existing offset cancellation methods generally may generate greater power consumption.

SUMMARY

According to various embodiments of the present disclosure, a sense amplifier circuit and a data read method are provided.

According to various embodiments of the present disclosure, there is provided a sense amplifier circuit, including: a first P-type transistor connected between a first signal terminal and a second complementary read bit line, the first P-type transistor having a control terminal connected to a first read bit line connected to a bit line; a second P-type transistor connected between a second signal terminal and a second read bit line, the second P-type transistor having a control terminal connected to a first complementary read bit line connected to a complementary bit line; a first N-type transistor connected between a third signal terminal and the second complementary read bit line, the first N-type transistor having a control terminal connected to the first read bit line; a second N-type transistor connected between a fourth signal terminal and the second read bit line, the second N-type transistor having a control terminal connected to the first complementary read bit line; a first offset cancellation subcircuit configured to connect the first read bit line to the second complementary read bit line in response to a first offset cancellation signal; a second offset cancellation subcircuit configured to connect the first complementary read bit line to the second read bit line in response to a second offset cancellation signal; and a first write-back subcircuit configured to connect the first complementary read bit line to the second complementary read bit line in response to a first write-back signal.

A data read method is applied to the above-mentioned sense amplifier circuit, and the data read method includes: in a precharge stage, precharging the bit line, the first read bit line, the complementary bit line, and the first complementary read bit line; in an offset cancellation stage, respectively providing a high-level signal and a low-level signal to the first signal terminal and the third signal terminal, and simultaneously turning on the first offset cancellation subcircuit, such that the first read bit line is connected to the second complementary read bit line; in a charge sharing stage, turning off the first offset cancellation subcircuit, turning on a memory cell, and turning on the first write-back subcircuit, such that the first complementary read bit line is connected to the second complementary read bit line; and in an amplification stage, providing a high-level signal to the first signal terminal and the second signal terminal, providing a low-level signal to the third signal terminal and the fourth signal terminal, and turning on the second write-back subcircuit simultaneously, such that the first read bit line is connected to the second read bit line.

BRIEF DESCRIPTION OF THE DRAWINGS

To describe the technical solutions of the embodiments of the present disclosure or those of the prior art more clearly, the accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

Figure 1:
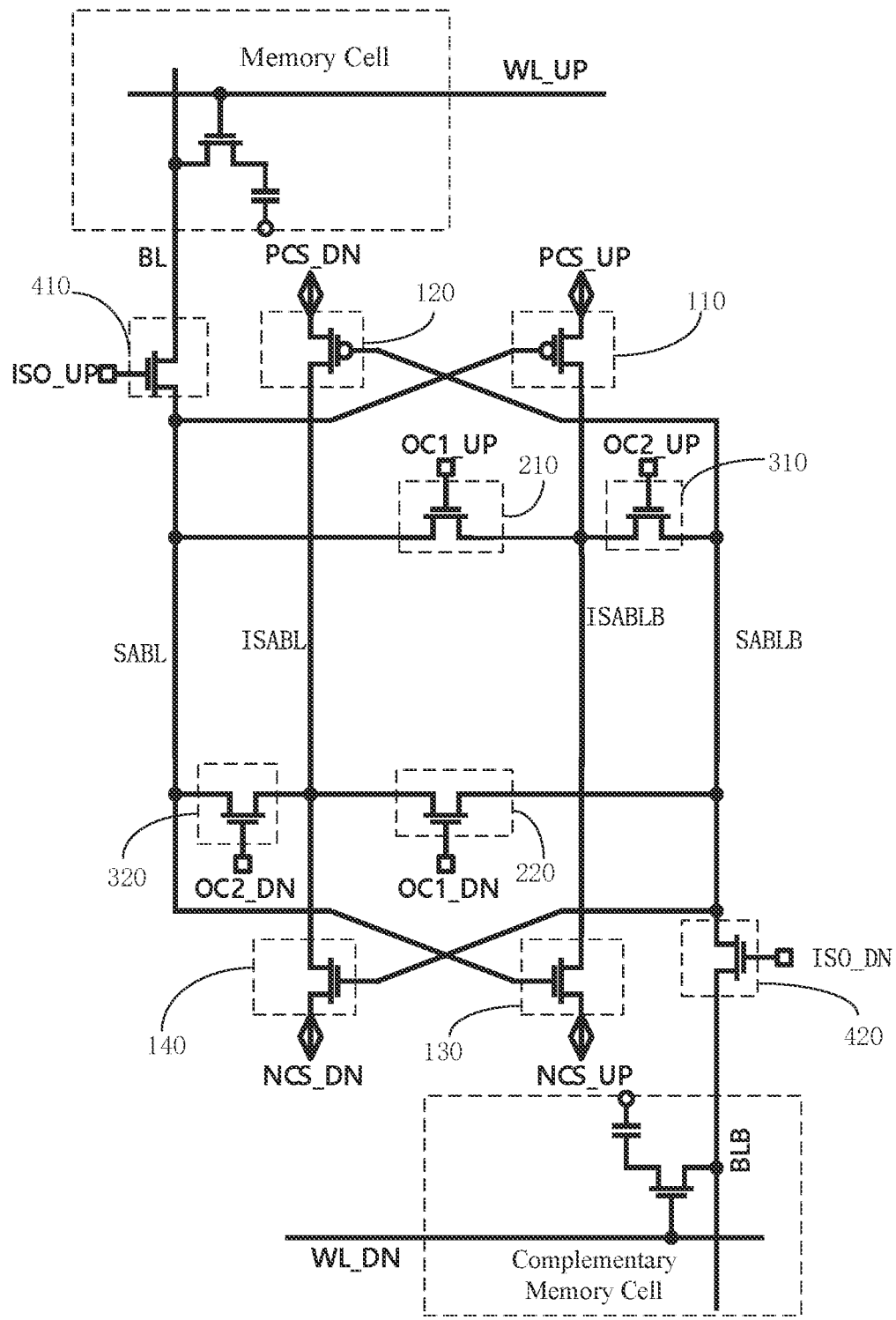
FIG. 1 is a schematic circuit diagram of a sense amplifier circuit provided in an embodiment.

Reference numerals in the accompanying drawings: 110—first P-type transistor, 111—first P-type active layer, 112—first gate layer, 120—second P-type transistor, 121—second P-type active layer, 122—second gate layer, 130—first N-type transistor, 131—first N-type active layer, 132—third gate layer, 140—second N-type transistor, 141—second N-type active layer, 142—fourth gate layer, 210—first offset cancellation subcircuit, 211—first offset-cancellation gate layer, 220—second offset cancellation subcircuit, 221—second offset-cancellation gate layer, 310—first write-back subcircuit, 311—first write-back gate layer, 320—second write-back subcircuit, 321—second write-back gate layer, 410—first isolation cell, 411—first isolation gate layer, 420—second isolation cell, 421—second isolation gate layer, 510—first precharge subcircuit, 511—first precharge gate layer, 520—second precharge subcircuit, 521—second precharge gate layer, 530—equalization subcircuit, 531—equalization gate layer, 540—third precharge subcircuit, 541—third precharge gate layer, 10—first active layer, 20—second active layer, 30—third active layer, 40—fourth active layer, and 50—fifth active layer.

To better describe and illustrate the embodiments and/or examples of those inventions disclosed herein, one or more drawings may be referred to. The additional details or examples for describing the drawings should not be considered as limiting the scope of any of the disclosed inventions, the currently described embodiments and/or examples, and the best mode of these inventions currently understood.

DETAILED DESCRIPTION

For ease of understanding the present disclosure, the present disclosure will be described more fully hereinafter with reference to the accompanying drawings. Embodiments of the present disclosure are presented in the accompanying drawings. However, the present disclosure may be embodied in many different forms and should not be limited to the embodiments set forth herein. Rather, these embodiments are provided such that the present disclosure will be more thorough and complete.

Figure 2:
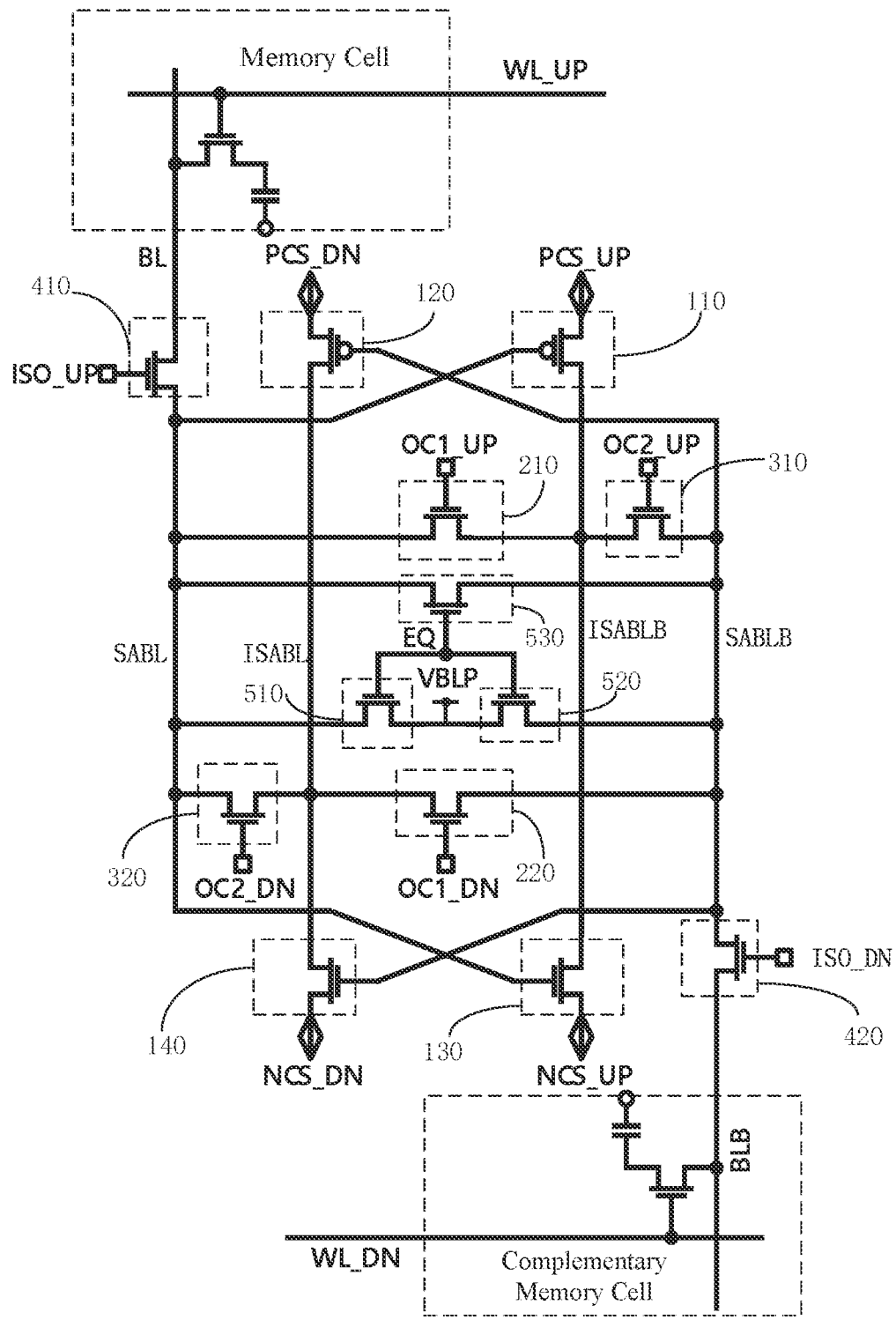
FIG. 2 is a schematic circuit diagram of a sense amplifier circuit provided in another embodiment.

In one embodiment, referring to FIG. 1 or FIG. 2, a sense amplifier circuit is provided, which includes: a first P-type transistor 110, a second P-type transistor 120, a first N-type transistor 130, a second N-type transistor 140, a first offset cancellation subcircuit 210, a second offset cancellation subcircuit 220, a first write-back subcircuit 310, and a second write-back subcircuit 320.

The first P-type transistor 110, the second P-type transistor 120, the first N-type transistor 130, and the second N-type transistor 140 form an amplifier subcircuit.

The first P-type transistor 110 is connected between a first signal terminal and a second complementary read bit line ISABLB, and has a control terminal connected to a first read bit line SABL. The first signal terminal is configured to receive a first level signal PCS_UP.

The first N-type transistor 130 is connected between a third signal terminal and the second complementary read bit line ISABLB, and has a control terminal connected to the first read bit line SABL. The third signal terminal is configured to receive a third level signal NCS_UP.

The first read bit line SABL is connected to a bit line BL.

The second P-type transistor 120 is connected between a second signal terminal and a second read bit line ISABL, and has a control terminal connected to a first complementary read bit line SABLB. The second signal terminal is configured to receive a second level signal PCS_DN.

The second N-type transistor is connected between a fourth signal terminal NCS_DN and the second read bit line ISABL, and has a control terminal connected to the first complementary read bit line SABLB. The fourth signal terminal is configured to receive a fourth level signal NCS_DN.

The first complementary read bit line SABLB is connected to a complementary bit line BLB.

The first offset cancellation subcircuit 210 is configured to connect the first read bit line SABL to the second complementary read bit line ISABLB in response to a first offset cancellation signal OC1_UP.

The second offset cancellation subcircuit 220 is configured to connect the first complementary read bit line SABLB to the second read bit line ISABL in response to a second offset cancellation signal OC1_DN.

The first write-back subcircuit 310 is configured to connect the first complementary read bit line SABLB to the second complementary read bit line ISABLB in response to a first write-back signal OC2_UP.

The second write-back subcircuit 320 is configured to connect the first read bit line SABL to the second read bit line ISABL in response to a second write-back signal OC2_DN.

In this embodiment, the first P-type transistor 110 and the second P-type transistor 120 are respectively connected to different first signal terminals and second signal terminals, such that high-level signals may be received at different moments. Meanwhile, the first N-type transistor 130 and the second N-type transistor 140 are respectively connected to different third signal terminals and fourth signal terminals, such that low-level signals may be received at different moments.

Meanwhile, the first offset cancellation subcircuit 210 and the second offset cancellation subcircuit 220 are respectively responsive to the first offset cancellation signal OC1_UP and the second offset cancellation signal OC1_DN, such that they may be independently controlled. Meanwhile, the first write-back subcircuit 310 and the second write-back subcircuit 320 are respectively responsive to the first write-back signal OC2_UP and the second write-back signal OC2_DN, such that they may be independently controlled. Therefore, this embodiment can effectively reduce energy consumption caused by offset cancellation.

Figure 3:
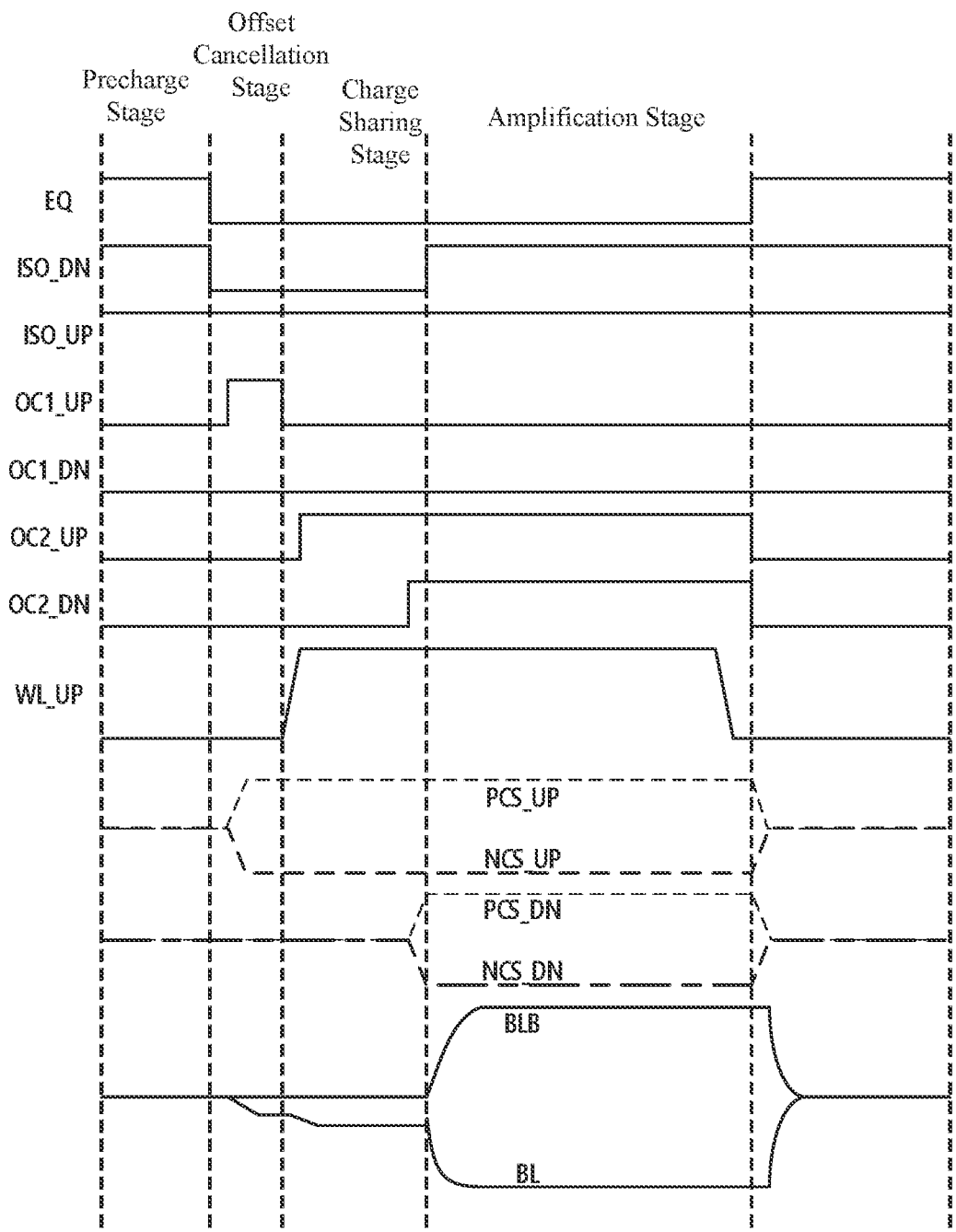
FIG. 3 is a schematic time sequence diagram of each control signal of a sense amplifier circuit when reading a memory cell according to an embodiment.

As an example, referring to FIG. 2 and FIG. 3, the process of reading data of a memory cell by means of the sense amplifier circuit of this embodiment may include:

in a precharge stage, precharging the bit line BL, the first read bit line SABL, the complementary bit line BLB, and the first complementary read bit line SABLB;

in an offset cancellation stage, respectively providing a high-level signal and a low-level signal to the first signal terminal and the third signal terminal, and simultaneously turning on the first offset cancellation subcircuit 210, such that the first read bit line SABL is connected to the second complementary read bit line ISABLB, that is, a gate a drain of the first N-type transistor are electrically connected;

in a charge sharing stage, turning off the first offset cancellation subcircuit 210, turning on a memory cell, and turning on the first write-back subcircuit 310, such that the first complementary read bit line SABLB is connected to the second complementary read bit line ISABLB; and in an amplification stage, providing a high-level signal and a low-level signal to the second signal terminal and the fourth signal terminal respectively, and turning on the first write-back subcircuit 310 and the second write-back subcircuit 320 simultaneously, such that the first read bit line SABL is connected to the second read bit line ISABL, and the first complementary read bit line SABLB is connected to the second complementary read bit line ISABLB.

In the precharge stage, the first signal terminal, the second signal terminal, the third signal terminal and the fourth signal terminal may also be precharged simultaneously. In some embodiments, a precharge voltage may be $$\frac{VDD}{2}.$$

In the offset cancellation stage, a high-level signal and a low-level signal are respectively provided to the first signal terminal and the third signal terminal. That is, the first level signal PCS_UP may be a high-level signal, and the third level signal NCS_UP may be is a low-level signal. The third level signal NCS_UP may be 0, and the first level signal PCS_UP may be VDD. Simultaneously, the first offset cancellation signal OC1_UP is provided, such that the first offset cancellation subcircuit 210 is turned on.

Because turn-on capability of the N-type transistor is greater than that of the P-type transistor, a voltage of the second complementary read bit line ISABLB between the first P-type transistor 110 and the first N-type transistor 130 is pulled down at this moment. The second complementary read bit line ISABLB is connected to the first read bit line SABL when the first offset cancellation subcircuit 210 is turned on. That is, a gate and a drain of the first N-type transistor are electrically connected, such that a voltage of the first read bit line SABL is pulled down.

Simultaneously, the first read bit line SABL is connected to the control terminal of the first P-type transistor 110 and the control terminal of the first N-type transistor 130, and the first read bit line SABL is connected to the bit line BL, such that offset noises caused by different turn-on capabilities of the first N-type transistor and the first P-type transistor can be effectively canceled.

Meanwhile, in this embodiment, the third signal terminal is independent of the first signal terminal, the fourth signal terminal is independent of the second signal terminal, and the first offset cancellation subcircuit 210 and the second offset cancellation subcircuit 220 are respectively responsive to different offset cancellation signals.

Therefore, in the offset cancellation stage, an electrical signal may not be provided to the third signal terminal and the fourth signal terminal, which are maintained at the precharge voltage, such as $$\frac{VDD}{2}.$$

Furthermore, when the first offset cancellation signal OC1_UP is provided to turn on the first offset cancellation subcircuit 210, the second offset cancellation signal OC1_DN is not provided and thus the second offset cancellation subcircuit 220 is not turned on. Therefore, at this moment, no offset cancellation may be performed on a side of the complementary bit line BLB, and thus the power consumption caused by the offset cancellation can be effectively reduced.

In the charge sharing stage, providing the first offset cancellation signal OC1_UP may be stopped, such that the first offset cancellation subcircuit 210 is turned off, thereby disconnecting the first read bit line SABL from the second complementary read bit line ISABLB. Simultaneously, a word line WL signal is provided to select and turn on a memory cell, such that a data signal stored in the memory cell is read out to the bit line BL, and is transmitted to the first read bit line SABL through the bit line BL.

In some embodiments, as an example, when a low-level signal corresponding to logic "0" is stored in the memory cell, the low-level signal corresponding to logic "0" may be superposed on a signal of the first read bit line SABL, such that the signal of the first read bit line SABL is pulled down.

In the amplification stage, a high-level signal is provided to the first signal terminal and the second signal terminal, and a low-level signal is provided to the third signal terminal and the fourth signal terminal respectively. That is, the first level signal PCS_UP and the second power level signal PCS_DN may be high-level signals, while the third level signal NCS_UP and the fourth level signal NCS_DN may be low-level signals. The third level signal NCS_UP and the fourth level signal NCS_DN may be 0, while the first level signal PCS_UP and the second level signal PCS_DN may be VDD.

Meanwhile, the first write-back signal OC1_UP and the second write-back signal OC2_DN may be provided as high-level signals to turn on the first write-back subcircuit 310 and the second write-back subcircuit 320. At this moment, the first read bit line SABL is connected to the second read bit line ISABL and the bit line BL, a signal of the bit line BL is effectively amplified, and the memory cell is written back, such that a voltage stored in the memory cell is returned to an original value after charge sharing. At this moment, the second complementary read bit line ISABLB is connected to the first complementary read bit line SABLB and the complementary bit line BLB, such that a signal of the complementary bit line BLB is effectively amplified.

The amplified signal of the bit line BL repeatedly acts on the gate of the first P-type transistor 110 and the gate of the first N-type transistor 130, to continuously amplify the signal of the complementary bit line BLB. Simultaneously, the amplified signal of the complementary bit line BLB repeatedly acts on the gate of the second P-type transistor 120 and the gate of the second N-type transistor 140, to continuously amplify the signal of the bit line BL.

It is to be understood that after the amplification stage, the precharge stage may be entered again for next data reading.

The process of reading data of a memory cell by means of the sense amplifier circuit of this embodiment is enumerated above. When data of a complementary memory cell is read by means of the sense amplifier circuit of this embodiment, in the offset cancellation stage, a high-level signal and a low-level signal are respectively provided to the second signal terminal and the fourth signal terminal, and the second offset cancellation signal OC1_DN is provided simultaneously, to turn on the second offset cancellation subcircuit 220, such that offset noises caused by different turn-on capabilities of the second N-type transistor and the second P-type transistor can be effectively canceled, and thus power consumption can be effectively reduced. Those skilled in the art can understand that the process of reading the data of the complementary memory cell is similar to the process of reading the data of the memory cell, and thus details are not repeated here.

In this embodiment, the third signal terminal connected to the second P-type transistor 120 is independent of the first signal terminal connected to the first P-type transistor 110, the fourth signal terminal connected to the second N-type transistor 140 is independent of the second signal terminal connected to the first N-type transistor 140, and the first offset cancellation subcircuit 210 and the second offset cancellation subcircuit 220 are respectively responsive to different offset cancellation signals. Therefore, in the offset cancellation stage, only the first P-type transistor 110 and the first N-type transistor 130 or the second P-type transistor 120 and the second N-type transistor 140 may be subjected to offset cancellation, such that offset noises caused by different turn-on capabilities of the P-type transistor and the N-type transistor can be effectively canceled, and the power consumption caused by the offset cancellation can be effectively reduced.

In one embodiment, referring to FIG. 1 or FIG. 2, the sense amplifier circuit further includes a first isolation cell 410 and a second isolation cell 420.

The first isolation cell 410 is configured to connect the bit line BL to the first read bit line SABL in response to a first isolation signal ISO_UP. The second isolation cell 420 is configured to connect the complementary bit line BLB to the first complementary read bit line SABLB in response to a second isolation signal ISO_DN.

Referring to FIG. 3, in the process of reading the data of the memory cell by means of the sense amplifier circuit of this embodiment, the first isolation signal ISO_UP may be always provided, such that the first isolation cell 410 is always on. At this moment, the bit line BL is always connected to the first read bit line SABL. Therefore, in the offset cancellation stage, when the voltage of the first read bit line SABL is pulled down, the voltage of the bit line BL is also pulled down, such that the offset cancellation may be performed more reliably.

The second isolation signal ISO_DN may be provided in the precharge stage and the amplification stage, such that the second isolation cell 420 is turned on. In the precharge stage, the second isolation cell 420 is turned on, such that the complementary bit line BLB and the first complementary read bit line SABLB may be precharged. The second isolation cell 420 is turned on in the amplification stage, such that the voltage of the complementary bit line BLB and the voltage of the bit line BL may be amplified simultaneously.

In one embodiment, referring to FIGS. 4-11, FIGS. 13-24 and FIGS. 26-37, the layout of the sense amplifier circuit has a first device area A1 and a second device area A2.

The first device area A1 includes a first P-type active layer 111, a first gate layer 112, a first N-type active layer 131, and a third gate layer 132. The first gate layer 112 is disposed on the first P-type active layer 111, and is configured to form the first P-type transistor 110 together with the first P-type active layer 111. The third gate layer 132 is disposed on the first N-type active layer 131, and is configured to form the first N-type transistor 130 together with the first N-type active layer 131.

The second device area A2 includes a second P-type active layer 121, a second gate layer 122, a second N-type active layer 141, and a fourth gate layer 142. The second gate layer 122 is disposed on the second P-type active layer 121, and is configured to form the second P-type transistor 120 together with the second P-type active layer 121. The fourth gate layer 142 is disposed on the second N-type active layer 141, and is configured to form the second N-type transistor 140 together with the second N-type active layer 141.

In this embodiment, the first P-type transistor 110 and the first N-type transistor 130 are formed in the same device area, such that during the process of reading the memory cell, an offset cancellation operation is performed on the first P-type transistor 110 and the first N-type transistor 130 by means of the first offset cancellation subcircuit 210. The second P-type transistor 120 and the second N-type transistor 140 are formed in the same device area, such that in the process of reading the complementary memory cell, the offset cancellation operation is performed on the second P-type transistor 120 and the second N-type transistor 140 by means of the second offset cancellation subcircuit 220.

In one embodiment, referring to FIGS. 4-11, FIGS. 13-24 and FIGS. 26-37, the first P-type active layer 111 and the second P-type active layer 121 are positioned between the first N-type active layer 131 and the second N-type active layer 141, or the first N-type active layer 131 and the second N-type active layer 141 are positioned between the first P-type active layer 111 and the second P-type active layer 121.

Figure 4:
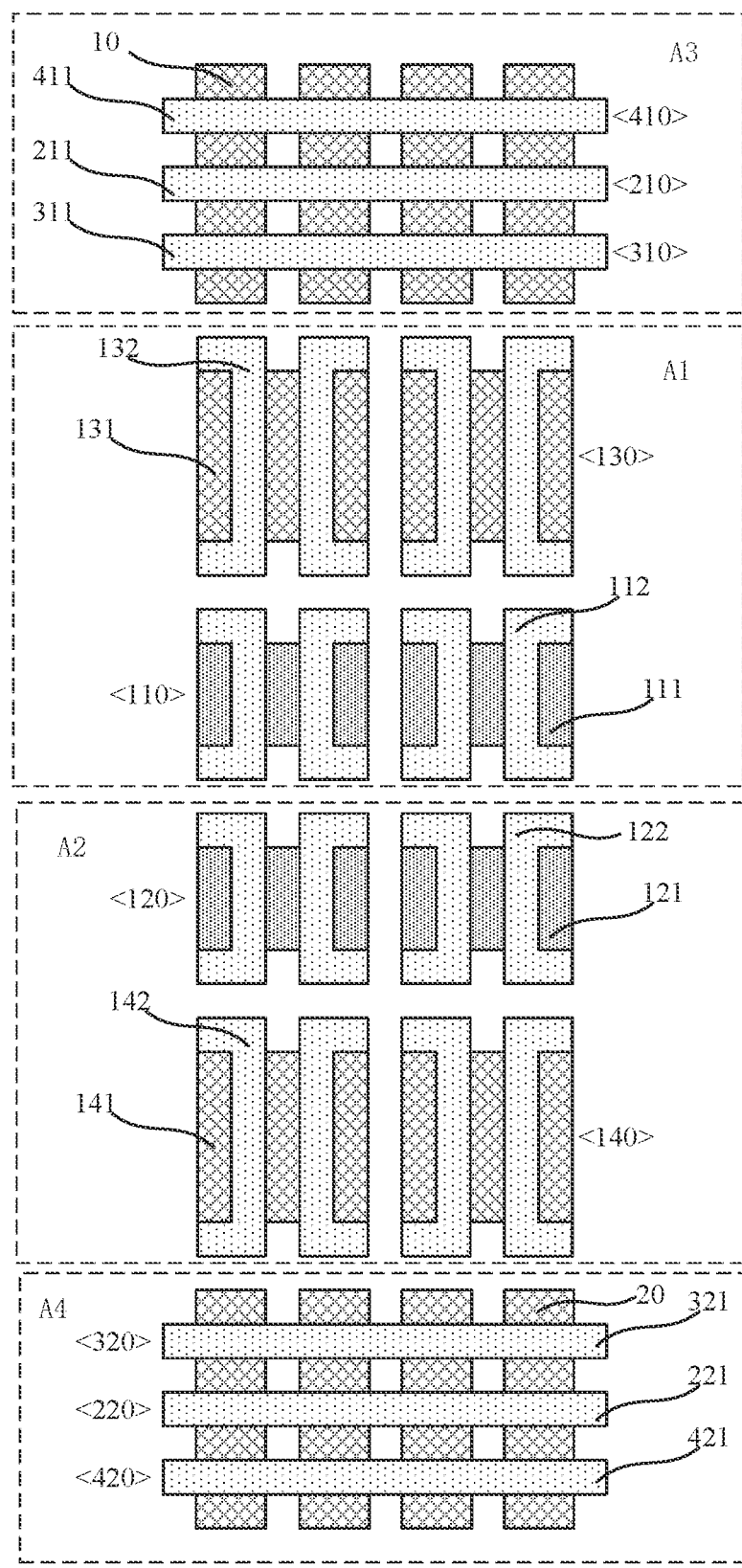
FIGS. 4 to 11 are schematic structural diagrams corresponding to the schematic circuit diagram of the sense amplifier circuit shown in FIG. 1 in different embodiments.

In one embodiment, with continued reference to FIG. 4, the layout of the sense amplifier circuit structure further includes a third device area A3 and a fourth device area A4.

The third device area A3 includes the first active layer 10 and a first isolation gate layer 411. The first isolation gate layer 411 is disposed on the first active layer 10. In addition, the first isolation gate layer 411 is configured to form the first isolation cell 410 together with the first active layer 10.

The fourth device area A4 includes a second active layer 20 and a second isolation gate layer 421, and the second isolation gate layer 421 is disposed on the second active layer 20. In addition, the second isolation gate layer 421 is configured to form the second isolation cell 420 together with the second active layer 20.

The first device area A1 and the second device area A2 are positioned between the third device area A3 and the fourth device area A4. That is, the third device area A3 and the fourth device area A4 are positioned on two sides, such that the first isolation cell 410 is connected to the bit line BL, and the second isolation cell 420 is connected to the complementary bit line BLB, which can reduce trace length and save layout space.

Figure 5:
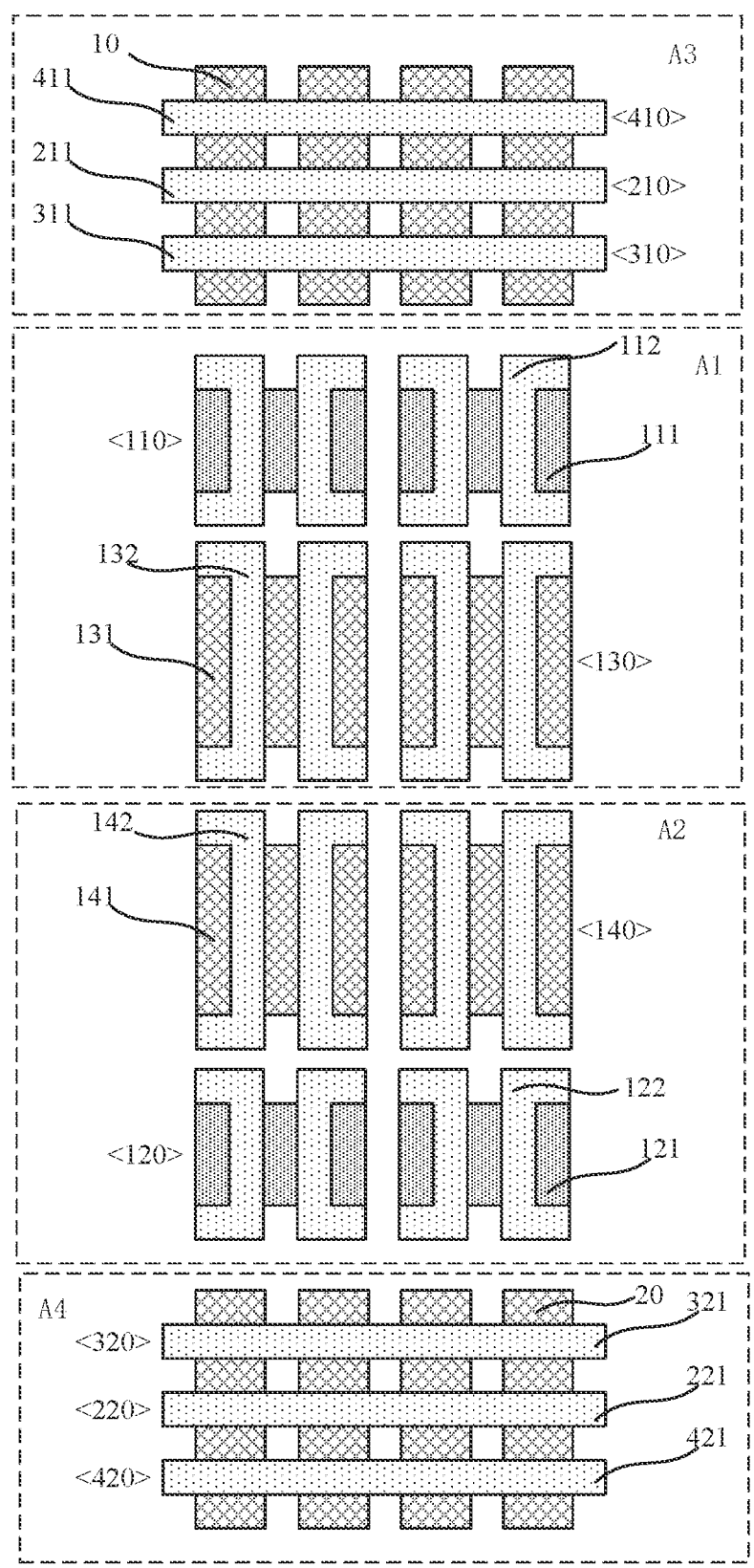

In one embodiment, referring to FIG. 4 or FIG. 5, the third device area A3 further includes a first offset-cancellation gate layer 211 and a first write-back gate layer 311. The first offset-cancellation gate layer 211 and the first write-back gate layer 311 are both disposed on the first active layer 10. The first offset-cancellation gate layer 211 is configured to form the first offset cancellation subcircuit 210 together with the first active layer 10. The first write-back gate layer 311 is configured to form the first write-back subcircuit 310 together with the first active layer 10.

At this moment, the first offset cancellation subcircuit 210, the first write-back subcircuit 310 and the first isolation cell 410 may be connected by means of the first active layer 10, thereby effectively saving circuit area.

The fourth device area A4 further includes a second offset-cancellation gate layer 221 and a second write-back gate layer 321. Both the second offset-cancellation gate layer 221 and the second write-back gate layer 321 are disposed on the second active layer 20. The second offset-cancellation gate layer 221 is configured to form the second offset cancellation subcircuit 220 together with the second active layer 20, and the second write-back gate layer 321 is configured to form the second write-back subcircuit 320 together with the second active layer 20.

At this moment, the second offset cancellation subcircuit 220, the second write-back subcircuit 320 and the second isolation cell 420 may be connected by means of the second active layer 20, thereby effectively saving circuit area.

Figure 6:
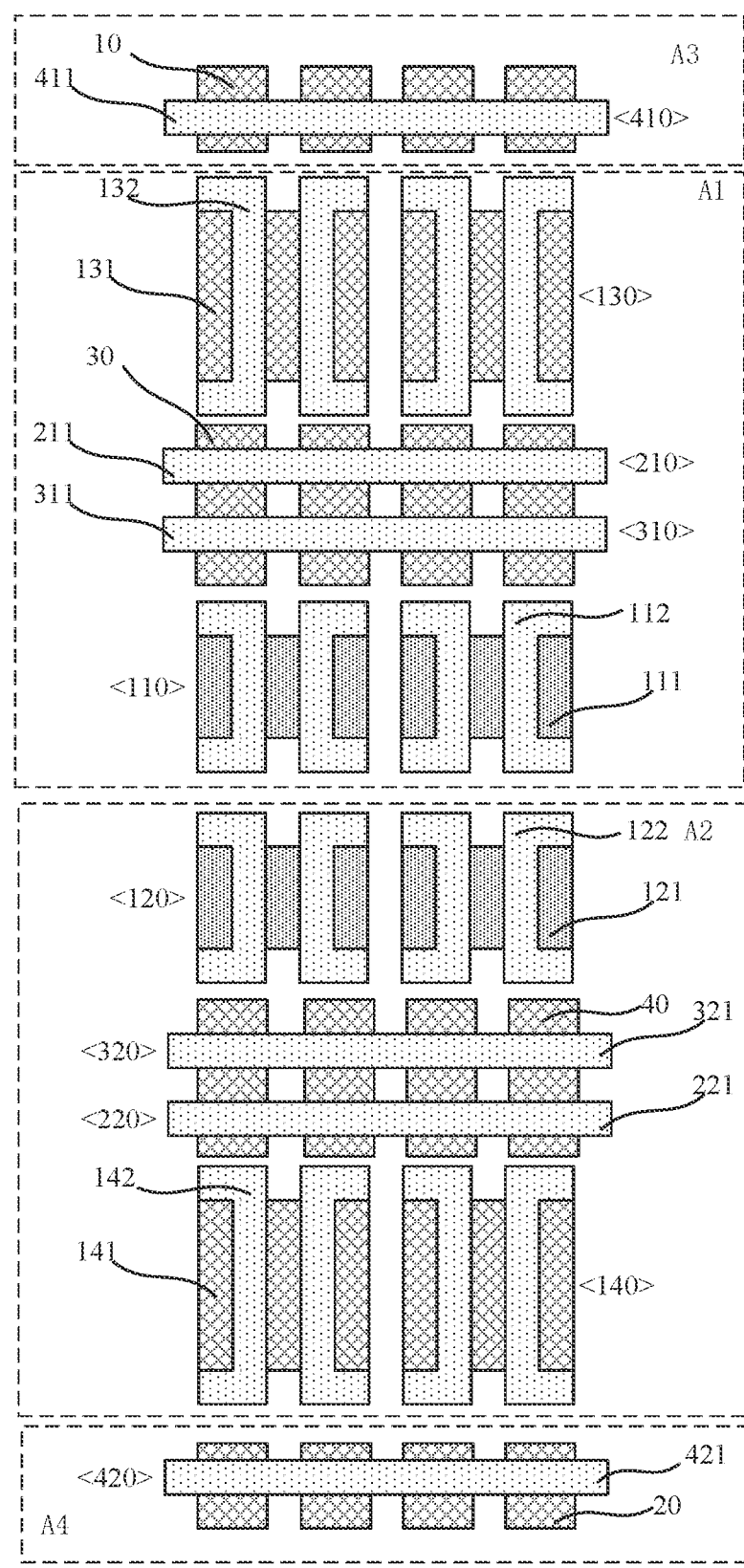
Figure 7:
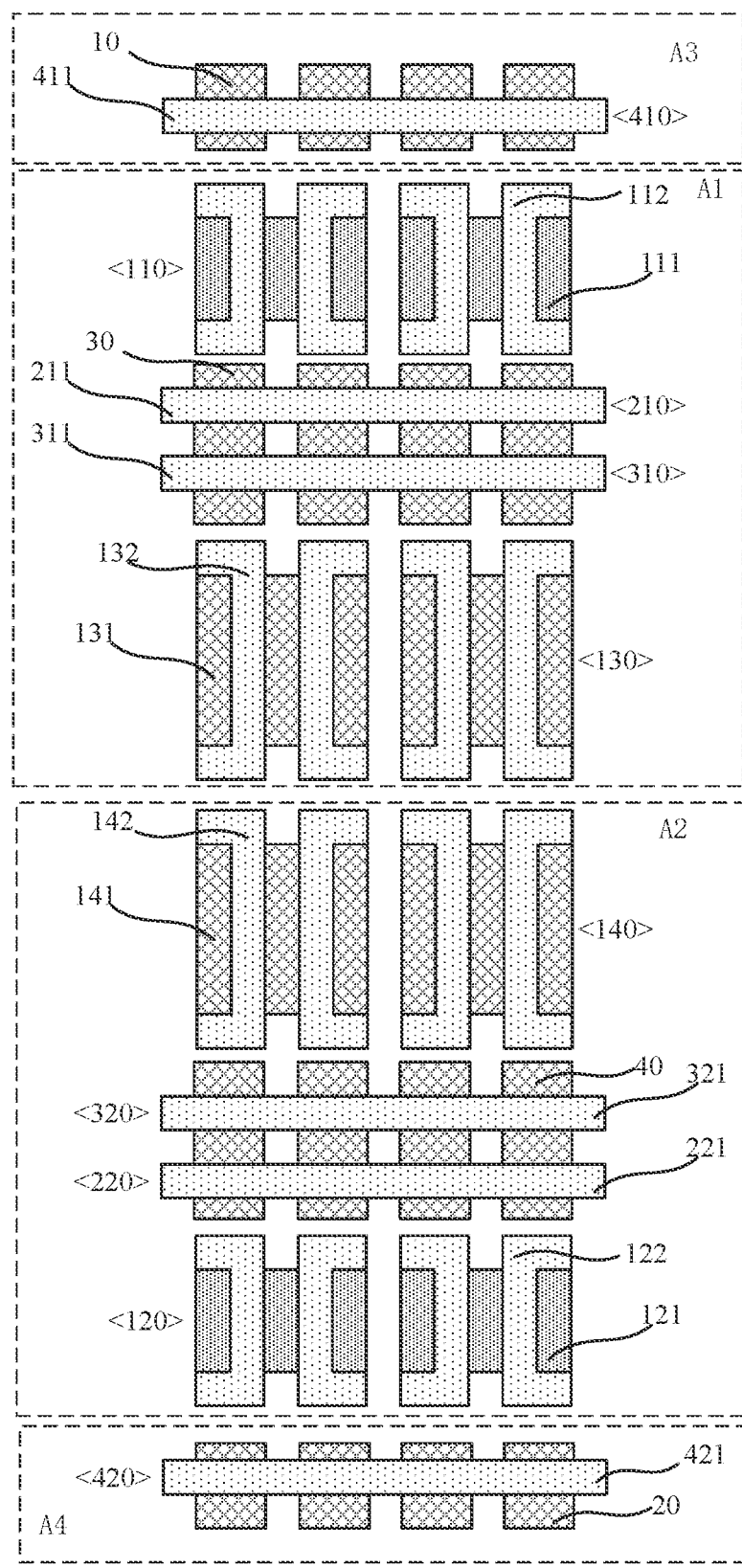

In one embodiment, referring to FIG. 6 or FIG. 7, the first device area A1 further includes a third active layer 30, the first offset-cancellation gate layer 211, and the first write-back gate layer 311. The first offset-cancellation gate layer 211 and the first write-back gate layer 311 are disposed on the third active layer 30.

The first offset-cancellation gate layer 211 is configured to form the first offset cancellation subcircuit 210 together with the third active layer 30. The first write-back gate layer 311 is configured to form the first write-back subcircuit 310 together with the third active layer 30. At this moment, the first offset cancellation subcircuit 210 and the first write-back subcircuit 310 may be connected by means of the third active layer 30.

Meanwhile, the third active layer 30 is positioned between the first P-type active layer 111 and the first N-type active layer 131, such that the first offset cancellation subcircuit 210 and the first write-back subcircuit 310 are positioned between the first P-type transistor 110 and the first N-type transistor 130, thereby making it convenient to connect the first offset cancellation subcircuit 210, the first write-back subcircuit 310, the first P-type transistor 110 and the first N-type transistor 130 to the second complementary read Bit line ISABLB.

The second device area A2 further includes a fourth active layer 40, a second offset-cancellation gate layer 221, and a second write-back gate layer 321. The second offset-cancellation gate layer 221 and the second write-back gate layer 321 are disposed on the fourth active layer 40. The second offset-cancellation gate layer 221 is configured to form the second offset cancellation subcircuit 220 together with the fourth active layer 40. The second write-back gate layer 321 and the fourth active layer 40 are configured to form the second write-back subcircuit 320. At this moment, the second offset cancellation subcircuit 220 may be connected to the second write-back subcircuit 320 by means of the fourth active layer 40.

Meanwhile, the fourth active layer 40 is positioned between the second P-type active layer 121 and the second N-type active layer 141, such that the second offset cancellation subcircuit 220 and the second write-back subcircuit 320 are positioned between the second P-type transistor 120 and the second N-type transistor 140, thereby making it convenient to connect the second offset cancellation subcircuit 220, the second write-back subcircuit 320, the second P-type transistor 120 and the second N-type transistor 140 to the second read bit Line ISABL.

In one embodiment, referring to FIG. 8 or FIG. 9 or FIG. 10 or FIG. 11, the layout of the sense amplifier circuit further includes a fifth device area A5. The fifth device area A5 is positioned between the first device area A1 and the second device area A2, and the fifth device area A5 includes a fifth active layer 50, the first offset-cancellation gate layer 211, the first write-back gate layer 311, the second offset-cancellation gate layer 221, and the second write-back gate layer 321.

Figure 8:
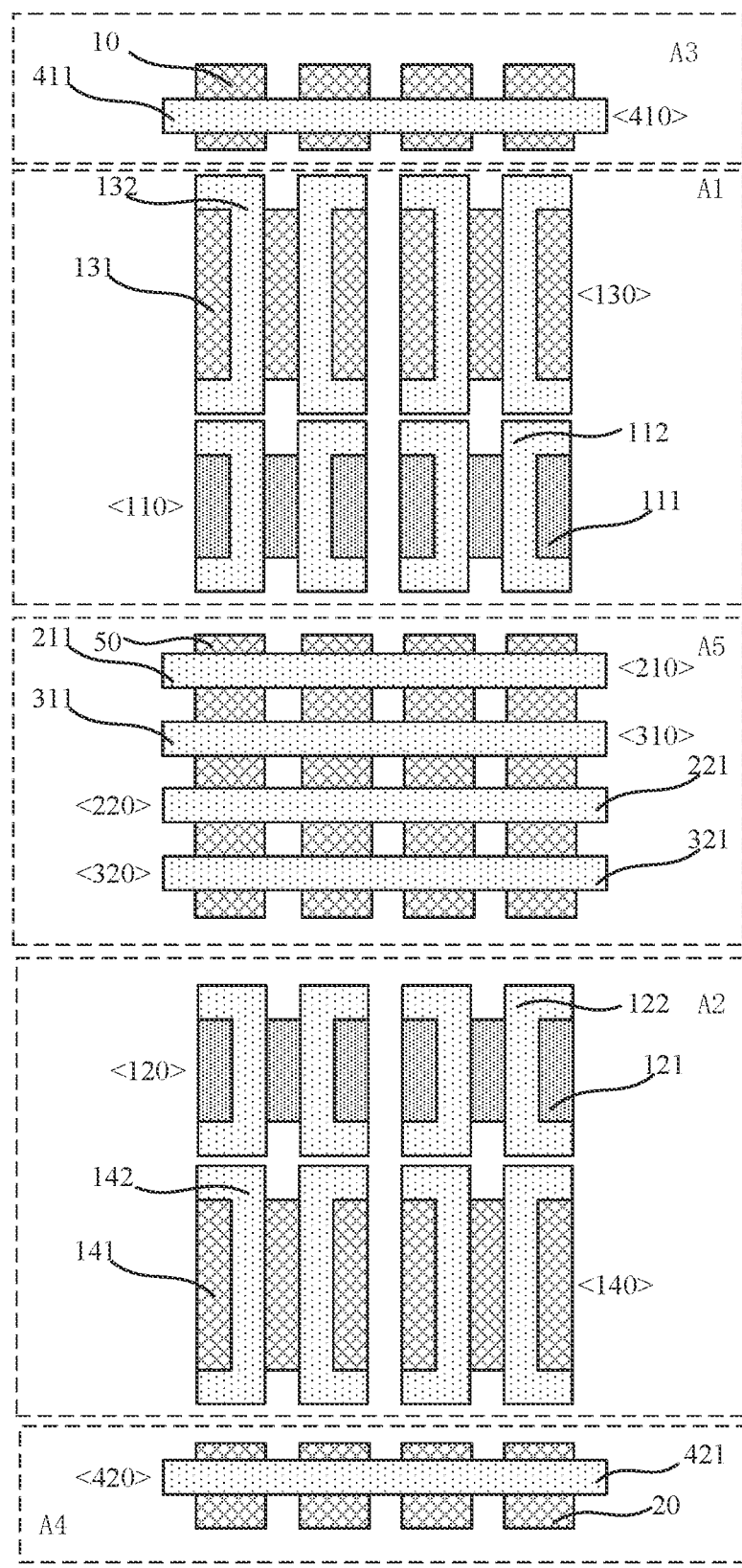
Figure 9:
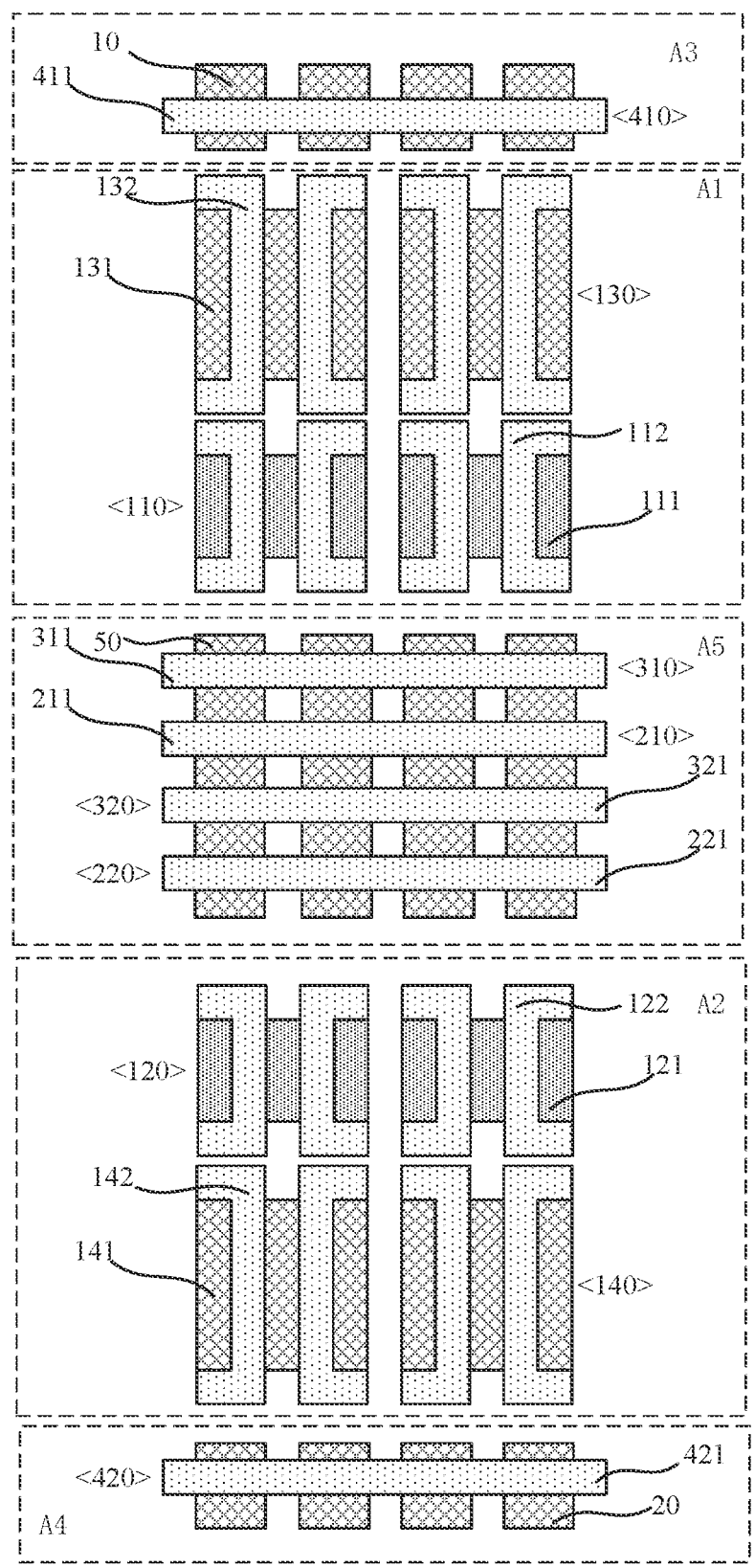
Figure 10:
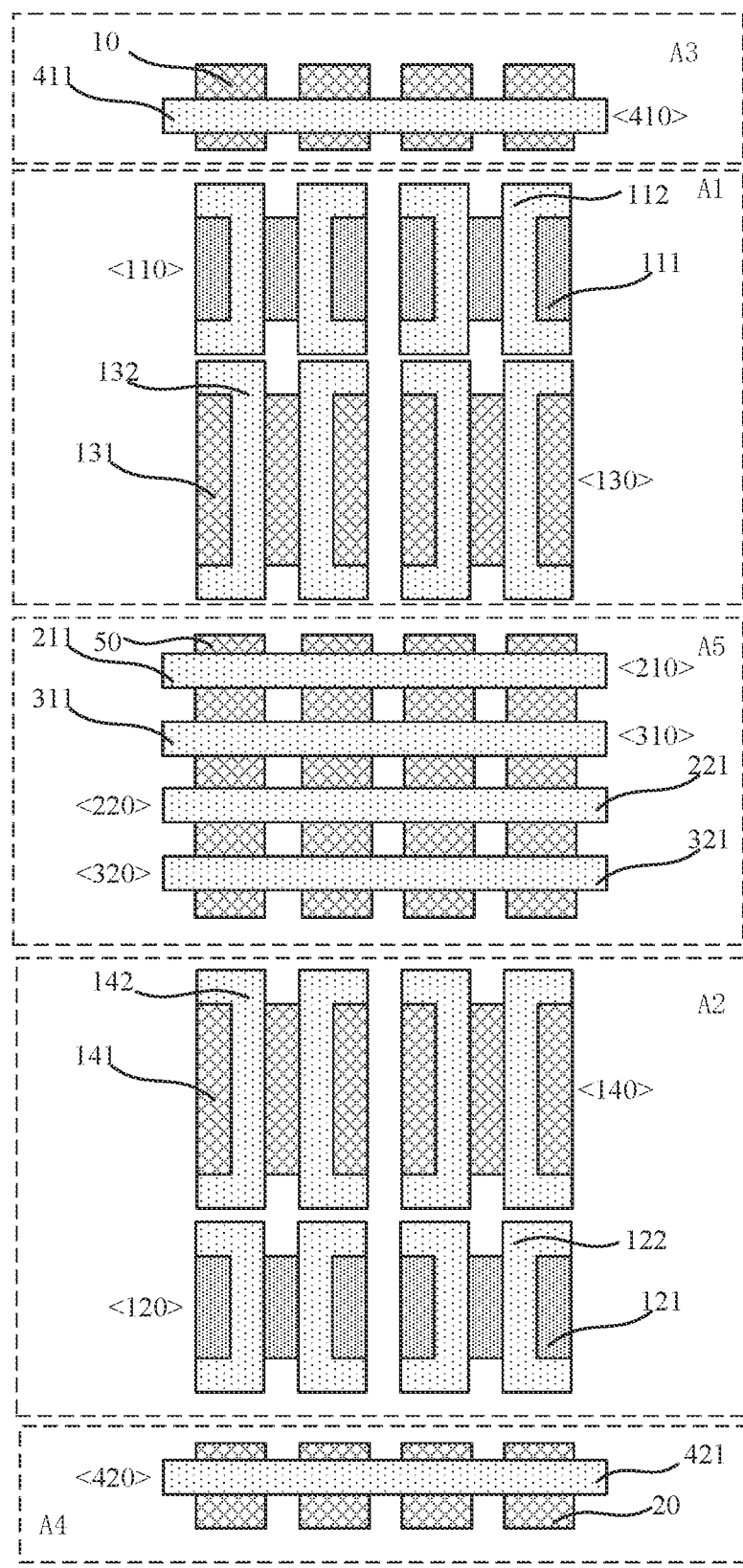
Figure 11:
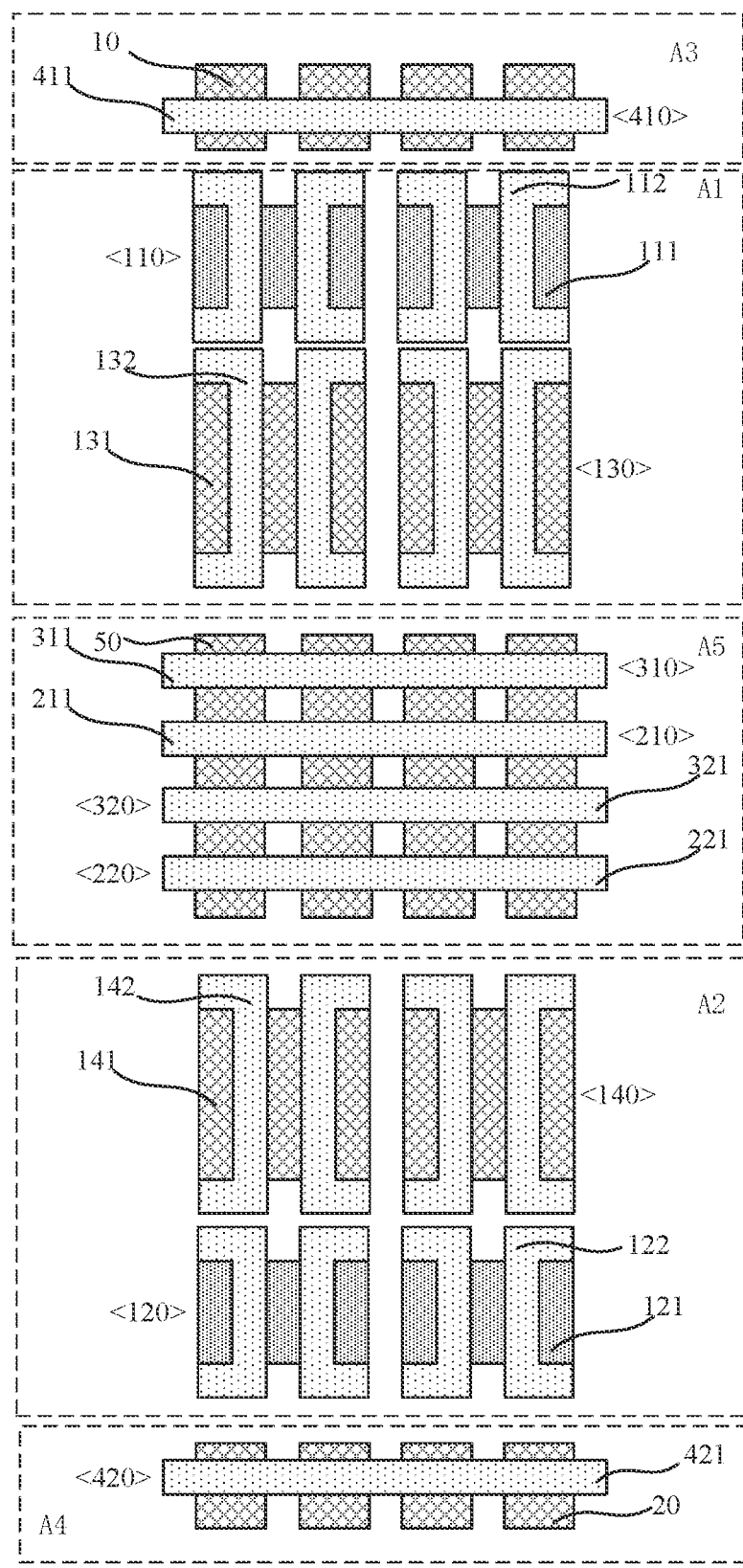

Referring to FIG. 8 or FIG. 10, along a direction directing from the first device area A1 to the second device area A2, the first offset-cancellation gate layer 211, the first write-back gate layer 311, the second offset-cancellation gate layer 221 and the second write-back gate layer 321 are sequentially disposed on the fifth active layer 50 at intervals. Referring to FIG. 9 or FIG. 11, along the direction directing from the first device area A1 to the second device area A2, the first write-back gate layer 311, the first offset-cancellation gate layer 211, the second write-back gate layer 321 and the second offset-cancellation gate layer 221 are sequentially disposed on the fifth active layer 50 at intervals.

The first offset-cancellation gate layer 211 is configured to form the first offset cancellation subcircuit 210 together with the fifth active layer 50. The first write-back gate layer 311 is configured to form the first write-back subcircuit 310 together with the fifth active layer 50. The second offset-cancellation gate layer 221 is configured to form the second offset cancellation subcircuit 220 together with the fifth active layer 50. The second write-back gate layer 321 is configured to form the second write-back subcircuit 320 together with the fifth active layer 50.

At this moment, the first offset cancellation subcircuit 210, the first write-back subcircuit 310, the second offset cancellation subcircuit 220 and the second write-back subcircuit 320 may be connected by means of the fifth active layer 50.

In one embodiment, the first isolation cell 410 includes a first isolation transistor. There may be a plurality of first isolation transistors in the first isolation cell 410, and of course there may also be only one first isolation transistor.

A gate of the first isolation transistor is configured to receive the first isolation signal ISO_UP. A source of the first isolation transistor is connected to one of the bit line BL and the first read bit line SABL. A drain of the first isolation transistor is connected to other one of the bit line BL and the first read bit line SABL.

The second isolation cell 420 includes a second isolation transistor. There may be a plurality of second isolation transistors in the second isolation cell 420, and of course there may also be only one second isolation transistor.

A gate of the second isolation transistor is configured to receive the second isolation signal ISO_DN, a source of the second isolation transistor is connected to one of the complementary bit line BLB and the first complementary read bit line SABLB, and a drain of the second isolation transistor is connected to other one of the complementary bit line BLB and the first complementary read bit line SABLB.

It can be understood here that, the first isolation transistor and/or the second isolation transistor may be an N-type transistor or a P-type transistor, which is not limited in this embodiment.

Figure 12:
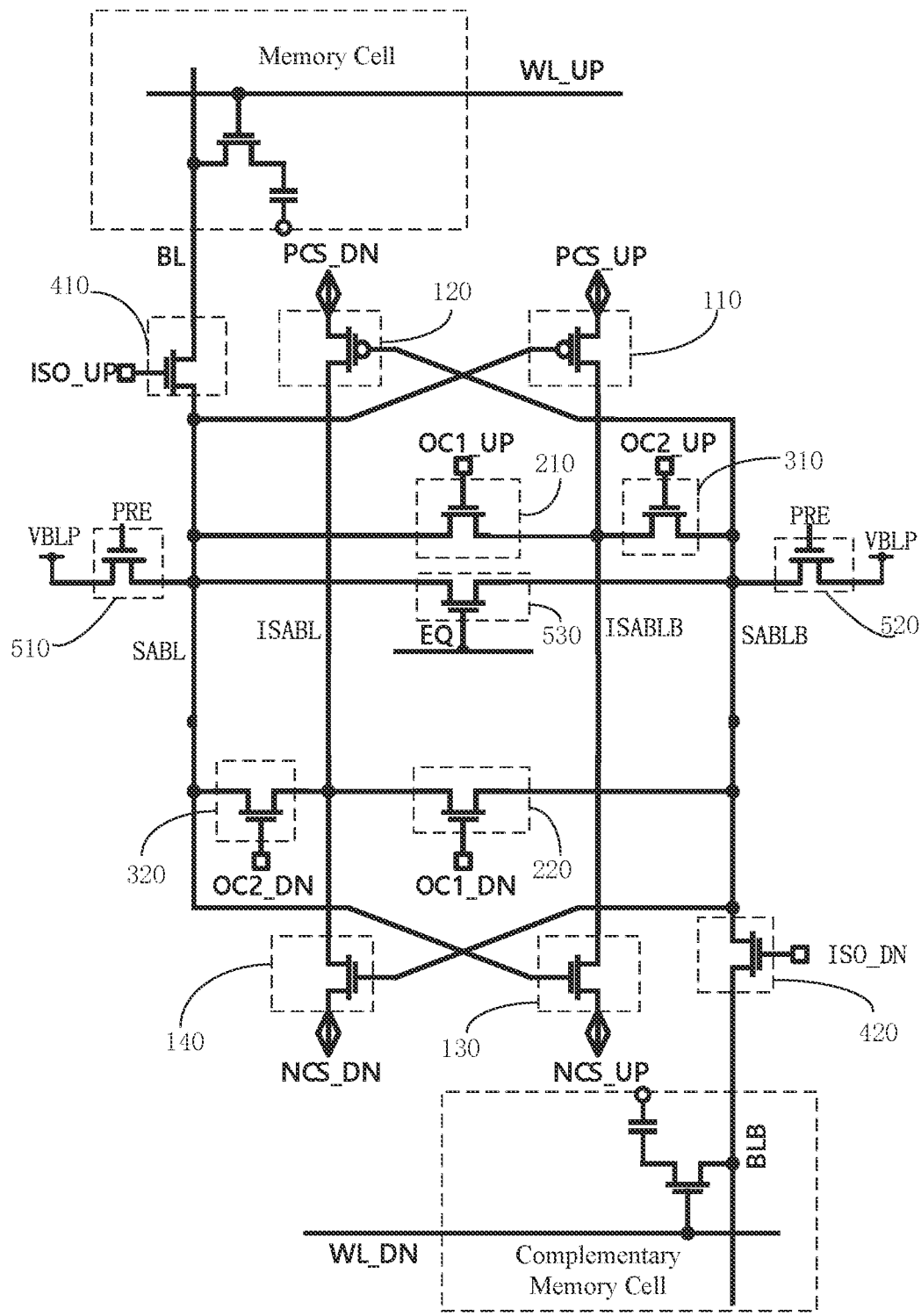
FIG. 12 is a schematic circuit diagram of a sense amplifier circuit provided in another embodiment.

In one embodiment, referring to FIG. 12 or FIG. 2, the sense amplifier circuit further includes a first precharge subcircuit 510, a second precharge subcircuit 520, and an equalization subcircuit 530.

The first precharge subcircuit 510 is configured to connect the first read bit line SABL to a precharge signal terminal in response to a precharge signal PRE. The second precharge subcircuit 520 is configured to connect the first complementary read bit line SABLB to the precharge signal terminal in response to the precharge signal PRE. The precharge signal terminal is configured to receive a precharge voltage VBLP. In some embodiments, VBLP may be equal to VDD/2.

The equalization subcircuit 530 is configured to connect the first read bit line SABL to the first complementary read bit line SABLB in response to an equalization signal EQ, to equalize the voltage between the first read bit line SABL and the first complementary read bit line SABLB.

In the precharge stage, the equalization signal EQ and the precharge signal PRE may be provided, to precharge the first read bit line SABL and the first complementary read bit line SABLB and to equalize the voltage between the first read bit line SABL and the first complementary read bit line SABLB.

In one embodiment, the first precharge subcircuit 510 includes a first precharge transistor. There may be one or more first precharge transistors in the first precharge subcircuit 510.

A gate of the first precharge transistor is configured to receive the precharge signal PRE. A source of the first precharge transistor is connected to one of the first read bit line SABL and the precharge signal terminal. The drain of the first isolation transistor is connected to other one of the first read bit line SABL and the precharge signal terminal.

The second precharge subcircuit 520 includes a second precharge transistor. There may be one or more second precharge transistors in the second precharge subcircuit 520.

A gate of the second precharge transistor is configured to receive the precharge signal PRE. A source of the second precharge transistor is connected to one of the first complementary read bit line SABLB and the precharge signal terminal. A drain of the first precharge transistor is connected to other one of the first complementary read bit line SABLB and the precharge signal terminal.

The equalization subcircuit 530 includes an equalization transistor. There may be one or more equalization transistors in the equalization subcircuit 530.

A gate of the equalization transistor is configured to receive the equalization signal EQ. The source of the first precharge transistor is connected to one of the first read bit line SABL and the first complementary read bit line SABLB, and the drain of the first isolation transistor is connected to other one of the first read bit line SABL and the first complementary read bit line SABL.

In one embodiment, referring to FIG. 2, the gate of the first precharge transistor, the gate of the second precharge transistor and the gate of the equalization transistor 530 are connected to the same control terminal, such that the precharge signal PRE and the equalization signal EQ may be obtained simultaneously by means of the control terminal. In this case, circuit control may be simplified.

Of course, in other embodiments, the gate of the first precharge transistor, the gate of the second precharge transistor, and the gate of the equalization transistor 530 may also be connected to different control terminals, which is not limited herein.

Figure 13:
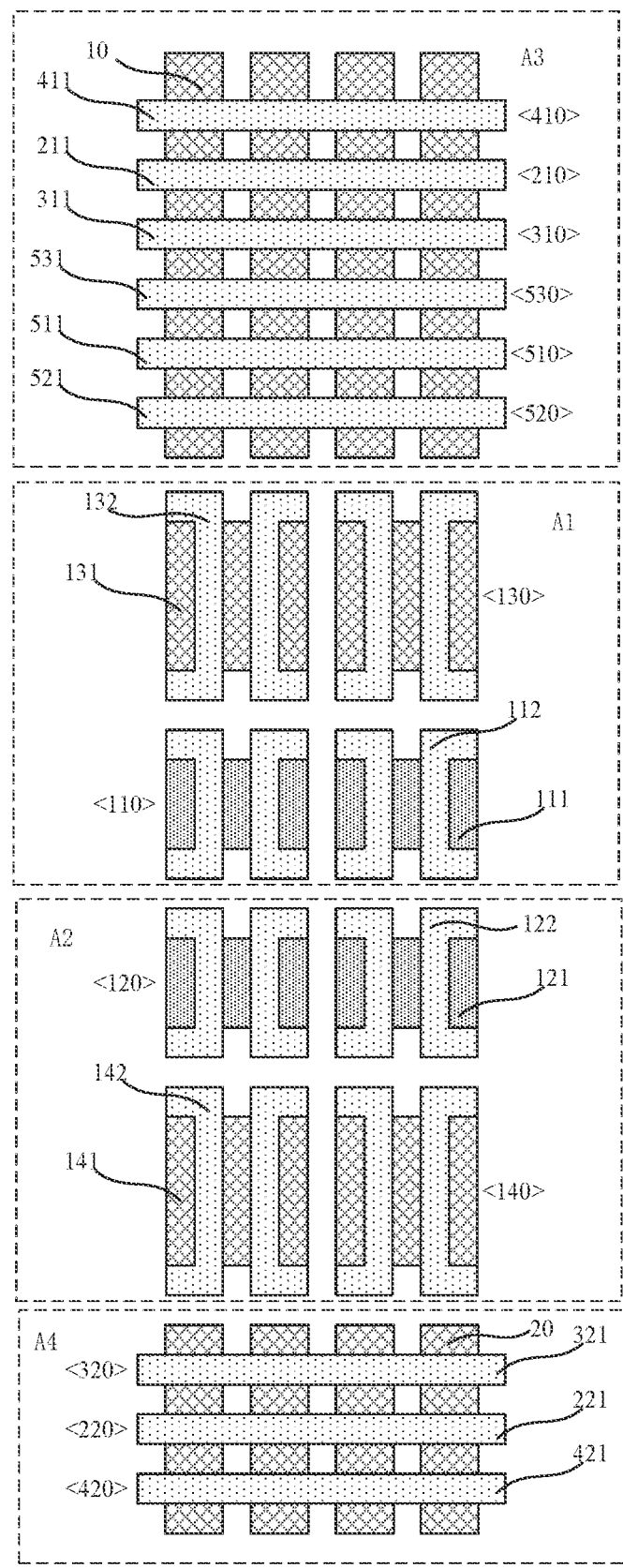
FIGS. 13 to 24 are schematic structural diagrams corresponding to the schematic circuit diagram of the sense amplifier circuit shown in FIG. 12 in different embodiments.
Figure 14:
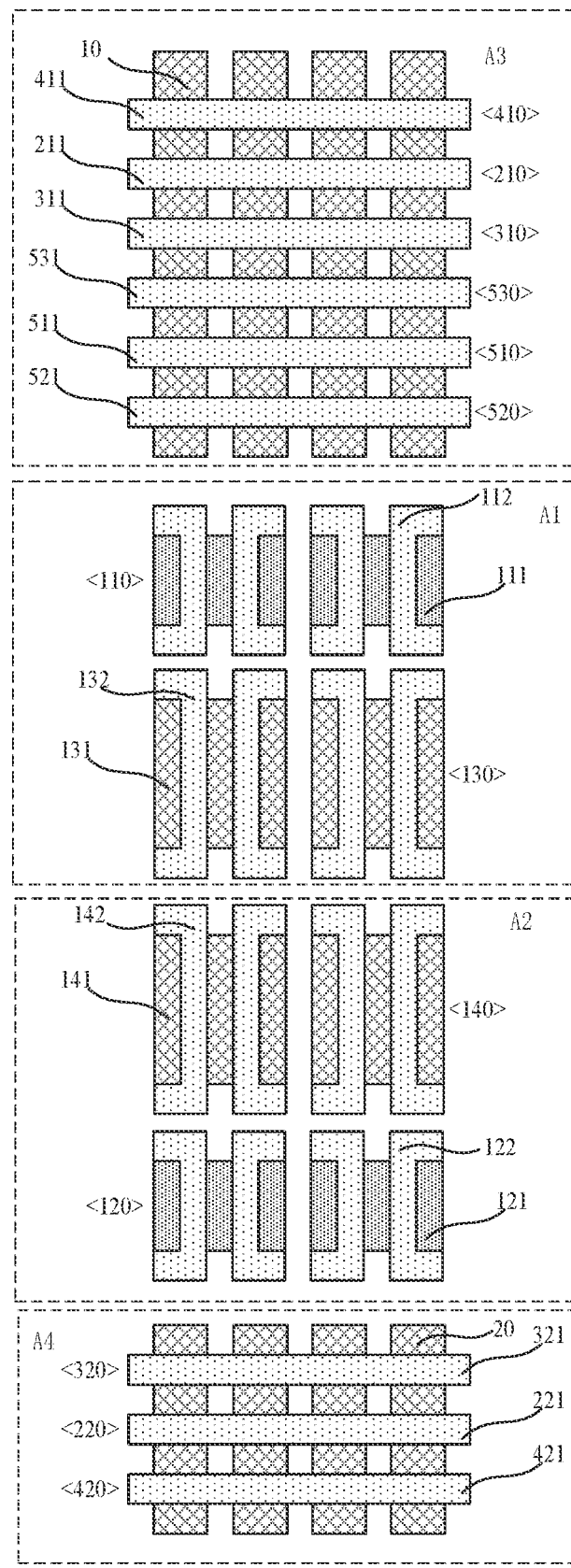

In one embodiment, referring to FIG. 13 or FIG. 14, along a direction directing from the third device area A3 to the first device area A1, the third device area A3 further includes the first isolation gate layer 411, the first offset-cancellation gate layer 211, the first write-back gate layer 311, an equalization gate layer 531, a first precharge gate layer 511 and a second precharge gate layer 521 sequentially arranged on the first active layer 10 at intervals.

The first isolation gate layer 411 is configured to form the first isolation cell 410 together with the first active layer 10. The first offset-cancellation gate layer 211 is configured to form the first offset cancellation subcircuit 210 together with the first active layer 10. The first write-back gate layer 311 is configured to form the first write-back subcircuit 310 together with the first active layer 10. The equalization gate layer 531 is configured to form the equalization subcircuit 530 together with the first active layer 10. The first precharge gate layer 511 is configured to form the first precharge subcircuit 510 together with the first active layer 10. The second precharge gate layer 521 is configured to form the second precharge subcircuit 520 together with the first active layer 10.

Along a direction directing from the fourth device area A4 to the second device area A2, the fourth device area A4 further includes the second isolation gate layer 421, the second offset-cancellation gate layer 221 and the second write-back gate layer 321 sequentially arranged on the second active layer 20 at intervals. The second isolation gate layer 421 is configured to form the second isolation cell 420 together with the second active layer 20. The second offset-cancellation gate layer 221 is configured to form the second offset cancellation subcircuit 220 together with the second active layer 20. The second write-back gate layer 321 is configured to form the second write-back subcircuit 320 together with the second active layer 20.

Figure 15:
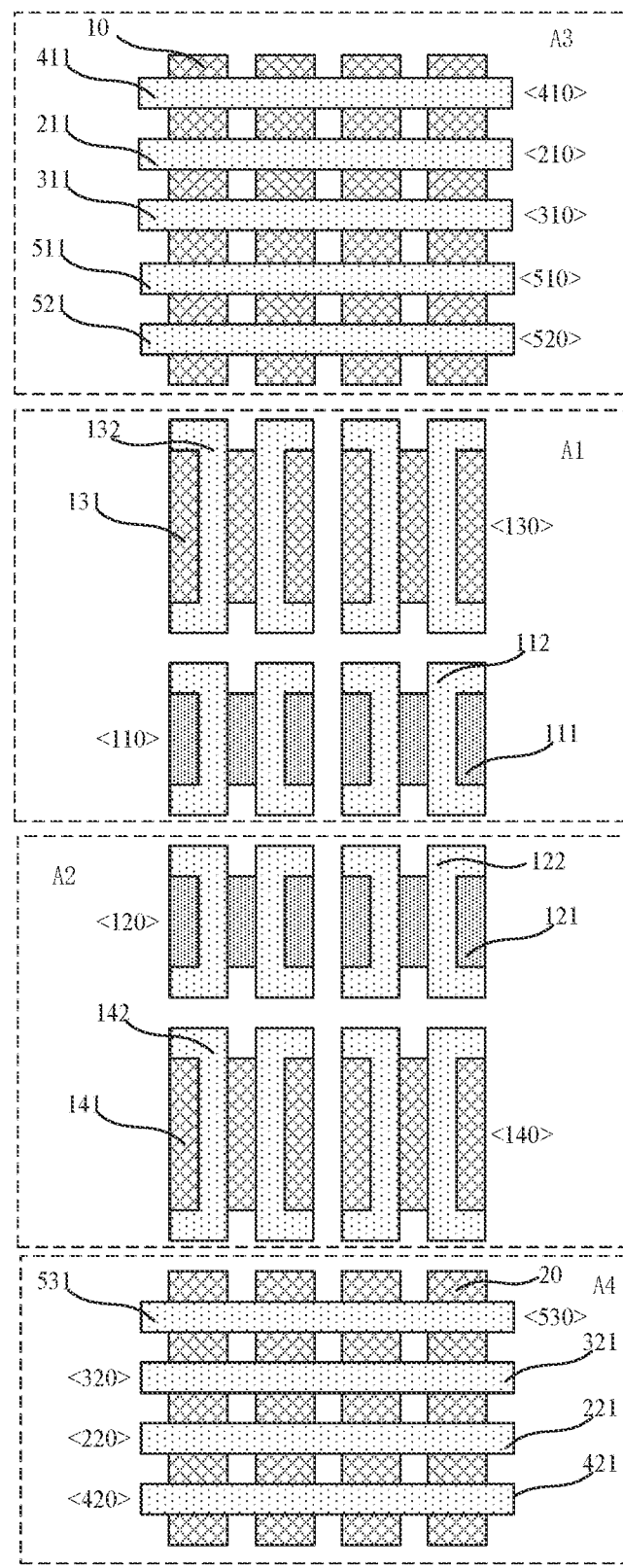
Figure 16:
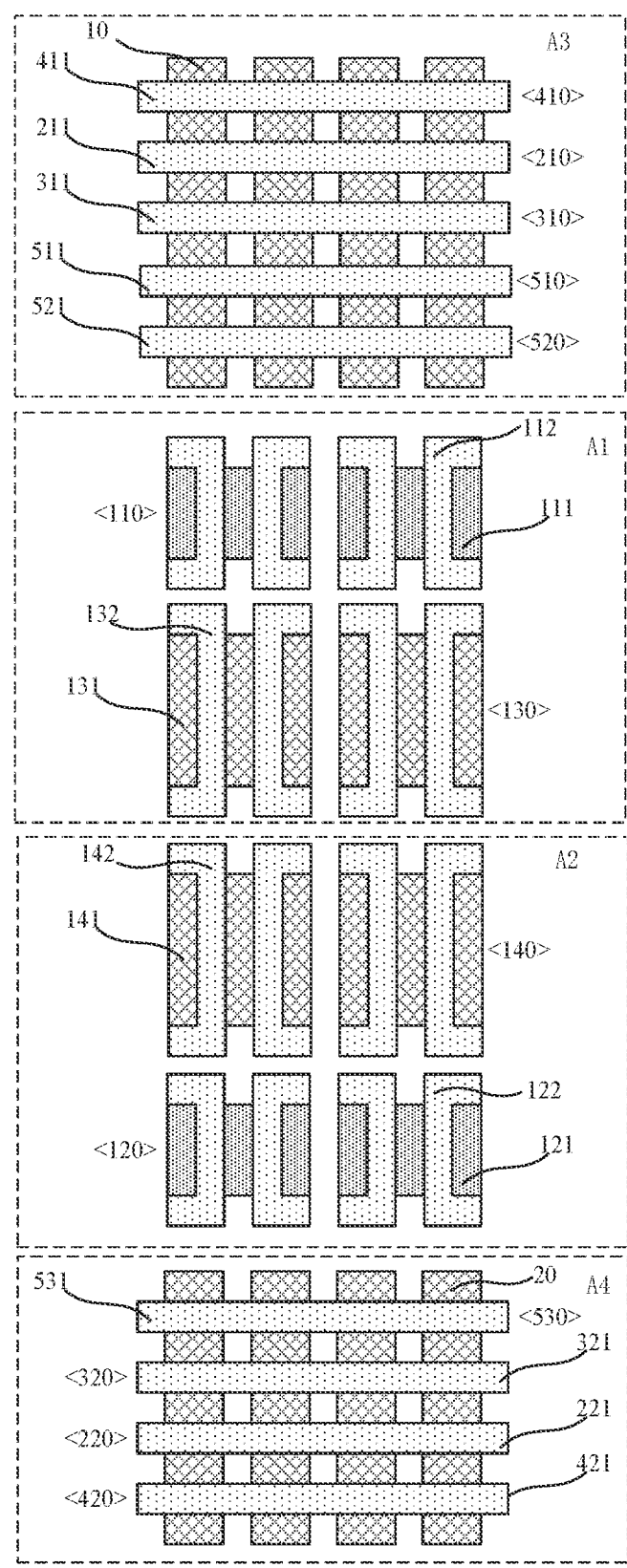

In one embodiment, referring to FIG. 15 or FIG. 16, along the direction directing from the third device area A3 to the first device area A1, the third device area A3 further includes the first isolation gate layer 411, the first offset-cancellation gate layer 211, the first write-back gate layer 311, the first precharge gate layer 511 and the second precharge gate layer 521 sequentially arranged on the first active layer 10 at intervals.

The first isolation gate layer 411 is configured to form the first isolation cell 410 together with the first active layer 10. The first offset-cancellation gate layer 211 is configured to form the first offset cancellation subcircuit 210 together with the first active layer 10. The first write-back gate layer 311 is configured to form the first write-back subcircuit 310 together with the first active layer 10. The first precharge gate layer 511 is configured to form the first precharge subcircuit 510 together with the first active layer 10. The second precharge gate layer 521 is configured to form the second precharge subcircuit 520 together with the first active layer 10.

Along the direction directing from the fourth device area A4 to the second device area A2, the fourth device area A4 further includes the second isolation gate layer 421, the second offset-cancellation gate layer 221, the second write-back gate layer 321 and the equalization gate layer 531 sequentially arranged on the second active layer 20 at intervals. The second isolation gate layer 421 is configured to form the second isolation cell 420 together with the second active layer 20. The second offset-cancellation gate layer 221 is configured to form the second offset cancellation subcircuit 220 together with the second active layer 20. The second write-back gate layer 321 is configured to form the second write-back subcircuit 320 together with the second active layer 20. The equalization gate layer 531 is configured to form the equalization subcircuit 530 together with the second active layer 20.

Figure 17:
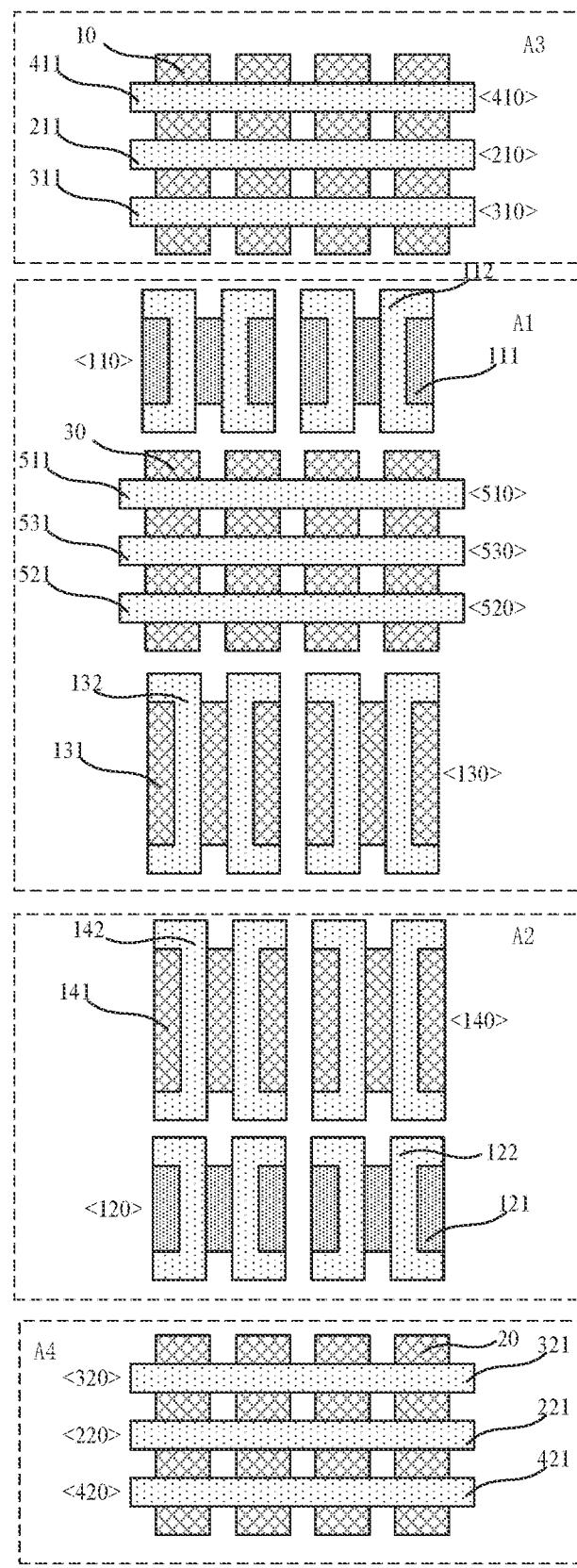

In one embodiment, referring to FIG. 17, the first device area A1 further includes the third active layer 30, the first precharge gate layer 511, the equalization gate layer 531, and the second precharge gate layer 521. Along a direction directing from the first P-type active layer 111 to the first N-type active layer 131, the first precharge gate layer 511, the equalization gate layer 531 and the second precharge gate layer 521 are sequentially arranged at intervals on the third active layer 30.

The third active layer 30 is positioned between the first P-type active layer 111 and the first N-type active layer 131. The first precharge gate layer 511 is configured to form the first precharge subcircuit 510 together with the third active layer 30. The equalization gate layer 531 is configured to form the equalization subcircuit 530 together with the third active layer 30. The second precharge gate layer 521 is configured to form the second precharge subcircuit 520 together with the third active layer 30.

Along the direction directing from the third device area A3 to the first device area A1, the third device area A3 further includes the first isolation gate layer 411, the first offset-cancellation gate layer 211 and the first write-back gate layer 311 sequentially arranged on the first active layer 10 at intervals. The first offset-cancellation gate layer 211 is configured to form the first offset cancellation subcircuit 210 together with the first active layer 10. The first write-back gate layer 311 is configured to form the first write-back subcircuit 310 together with the first active layer 10.

Along the direction directing from the fourth device area A4 to the second device area A2, the fourth device area A4 further includes the second isolation gate layer 421, the second offset-cancellation gate layer 221 and the second write-back gate layer 321 sequentially arranged on the second active layer 20 at intervals. The second offset-cancellation gate layer 221 is configured to form the second offset cancellation subcircuit 220 together with the second active layer 20. The second write-back gate layer 321 is configured to form the second write-back subcircuit 320 together with the second active layer 20.

Figure 18:
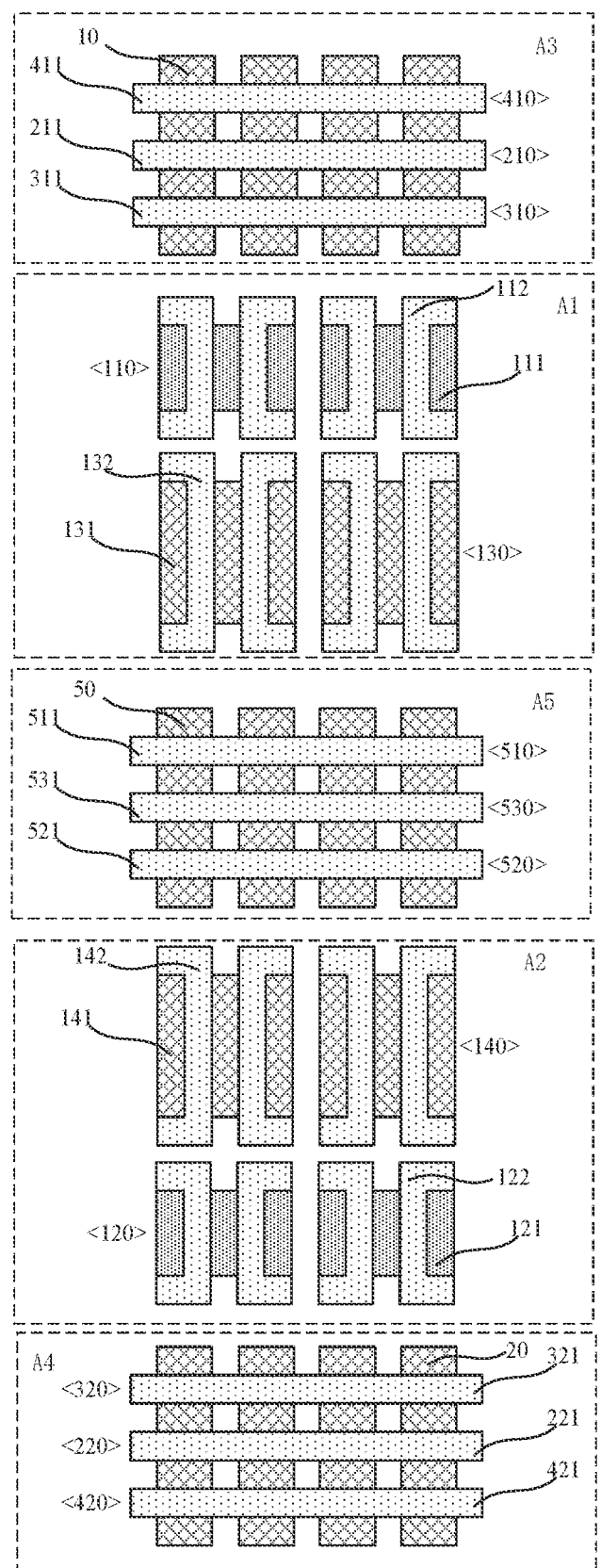

In one embodiment, referring to FIG. 18, the layout of the sense amplifier circuit also has a fifth device area A5. The fifth device area A5 is positioned between the first device area A1 and the second device area A2. The fifth device area A5 includes the fifth active layer 50, the first precharge gate layer 511, the equalization gate layer 531, and the second precharge gate layer 521. Along the direction directing from the first device area A1 to the second device area A2, the first precharge gate layer 511, the equalization gate layer 531 and the second precharge gate layer 521 are sequentially disposed on the fifth active layer 50 at intervals.

The first precharge gate layer 511 is configured to form the first precharge subcircuit 510 together with the fifth active layer 50. The equalization gate layer 531 is configured to form the equalization subcircuit 530 together with the fifth active layer 50. The second precharge gate layer 521 is configured to form the second precharge subcircuit 520 together with the fifth active layer 50.

Along the direction directing from the third device area A3 to the first device area A1, the third device area A3 further includes the first isolation gate layer 411, the first offset-cancellation gate layer 211 and the first write-back gate layer 311 sequentially arranged on the first active layer 10 at intervals. The first offset-cancellation gate layer 211 is configured to form the first offset cancellation subcircuit 210 together with the first active layer 10. The first write-back gate layer 311 is configured to form the first write-back subcircuit 310 together with the first active layer 10.

Along the direction directing from the fourth device area A4 to the second device area A2, the fourth device area A4 further includes the second isolation gate layer 421, the second offset-cancellation gate layer 221 and the second write-back gate layer 321 sequentially arranged on the second active layer 20 at intervals. The second offset-cancellation gate layer 221 is configured to form the second offset cancellation subcircuit 220 together with the second active layer 20. The second write-back gate layer 321 is configured to form the second write-back subcircuit 320 together with the second active layer 20.

Figure 19:
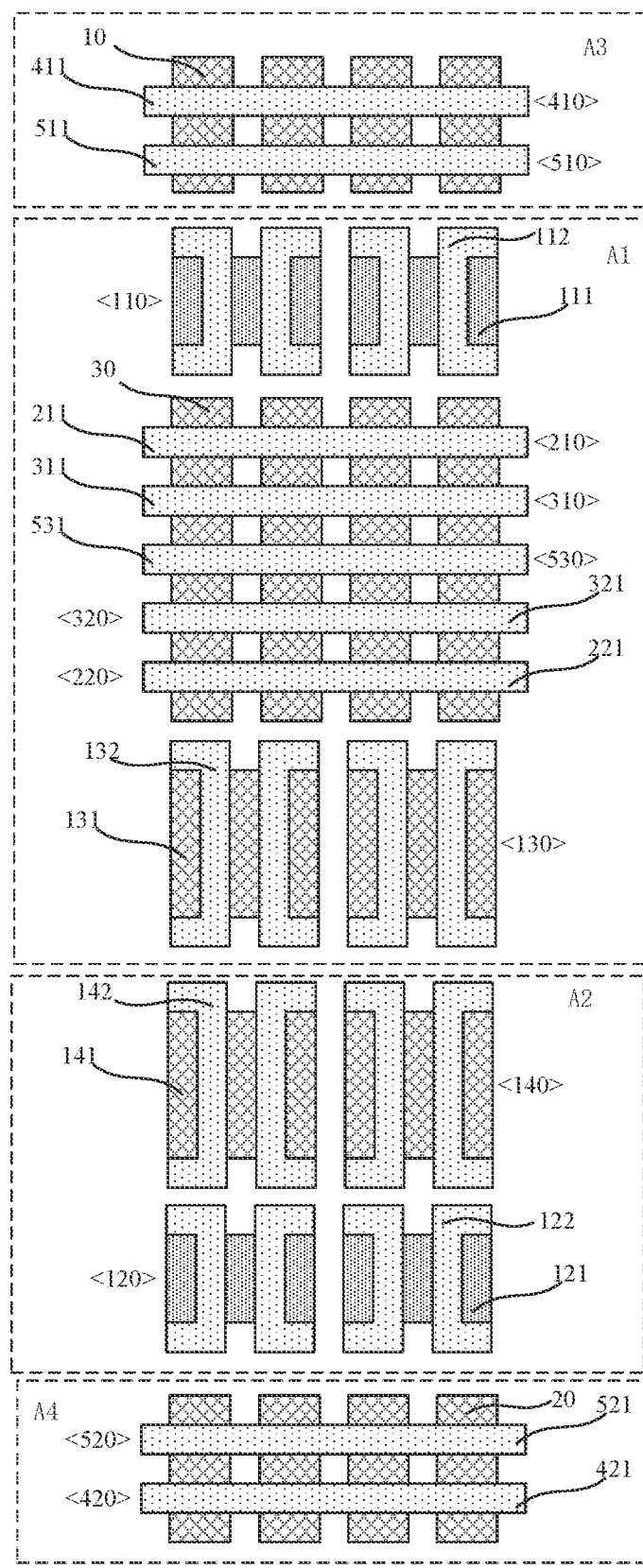

In one embodiment, referring to FIG. 19, the first device area A1 further includes the third active layer 30, the first offset-cancellation gate layer 211, the first write-back gate layer 311, the equalization gate layer 531, the second write-back gate layer 321, and the second offset-cancellation gate layer 221. Along the direction directing from the first P-type active layer 111 to the first N-type active layer 131, the first offset-cancellation gate layer 211, the first write-back gate layer 311, the equalization gate layer 531, the second write-back gate layer 321, and the second offset-cancellation gate layer 221 are sequentially disposed on the third active layer 30 at intervals.

The third active layer 30 is positioned between the first P-type active layer 111 and the first N-type active layer 131. The first offset-cancellation gate layer 211 is configured to form the first offset cancellation subcircuit 210 together with the third active layer 30. The first write-back gate layer 311 is configured to form the first write-back subcircuit 310 together with the third active layer 30. The equalization gate layer 531 is configured to form the equalization subcircuit 530 together with the third active layer 30. The second write-back gate layer 321 is configured to form the second write-back subcircuit 320 together with the third active layer 30. The second offset-cancellation gate layer 221 is configured to form the second offset cancellation subcircuit 220 together with the third active layer 30.

The third device area A3 further includes the first precharge gate layer 511 disposed on the first active layer 10. The first precharge gate layer 511 is configured to form the first precharge subcircuit 510 together with the first active layer 10.

The fourth device area A4 further includes the second precharge gate layer 521 disposed on the second active layer 20. The second precharge gate layer 521 is configured to form the second precharge subcircuit 520 together with the second active layer 20.

Figure 20:
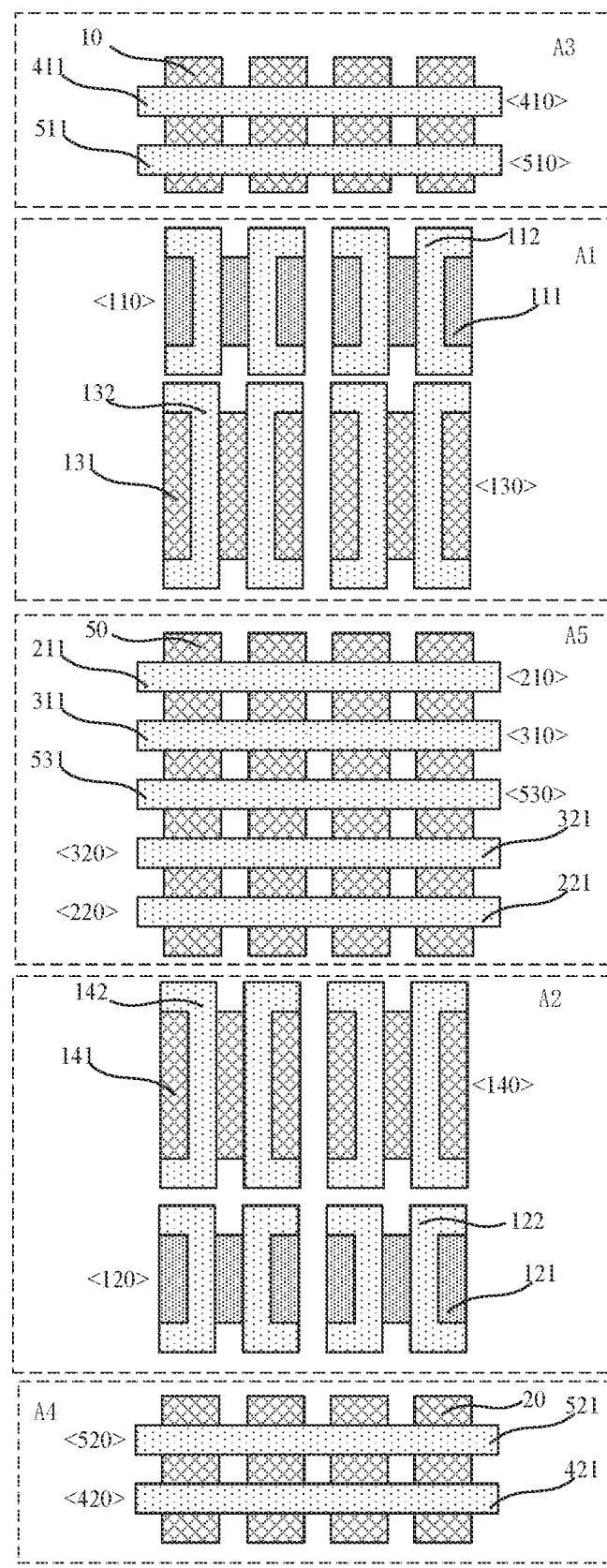

In one embodiment, referring to FIG. 20, the layout of the sense amplifier circuit also has a fifth device area A5. The fifth device area A5 is positioned between the first device area A1 and the second device area A2. The fifth device area A5 includes the fifth active layer 50, the first offset-cancellation gate layer 211, the first write-back gate layer 311, the equalization gate layer 531, the second write-back gate layer 321, and the second offset-cancellation gate layers 221. Along the direction directing from the first device area A1 to the second device area A2, the first offset-cancellation gate layer 211, the first write-back gate layer 311, the equalization gate layer 531, the second write-back gate layer 321, and the second offset-cancellation gate layer 221 are sequentially disposed on the fifth active layer 50 at intervals.

The first offset-cancellation gate layer 211 is configured to form the first offset cancellation subcircuit 210 together with the fifth active layer 50. The first write-back gate layer 311 is configured to form the first write-back subcircuit 310 together with the fifth active layer 50. The equalization gate layer 531 is configured to form the equalization subcircuit 530 together with the fifth active layer 50. The second write-back gate layer 321 is configured to form the second write-back subcircuit 320 together with the fifth active layer 50. The second offset-cancellation gate layer 221 is configured to form the second offset cancellation subcircuit 220 together with the fifth active layer 50.

The third device area A3 further includes the first precharge gate layer 511 disposed on the first active layer 10. The first precharge gate layer 511 is configured to form the first precharge subcircuit 510 together with the first active layer 10.

The fourth device area A4 further includes the second precharge gate layer 521 disposed on the second active layer 20. The second precharge gate layer 521 is configured to form the second precharge subcircuit 520 together with the second active layer 20.

Figure 21:
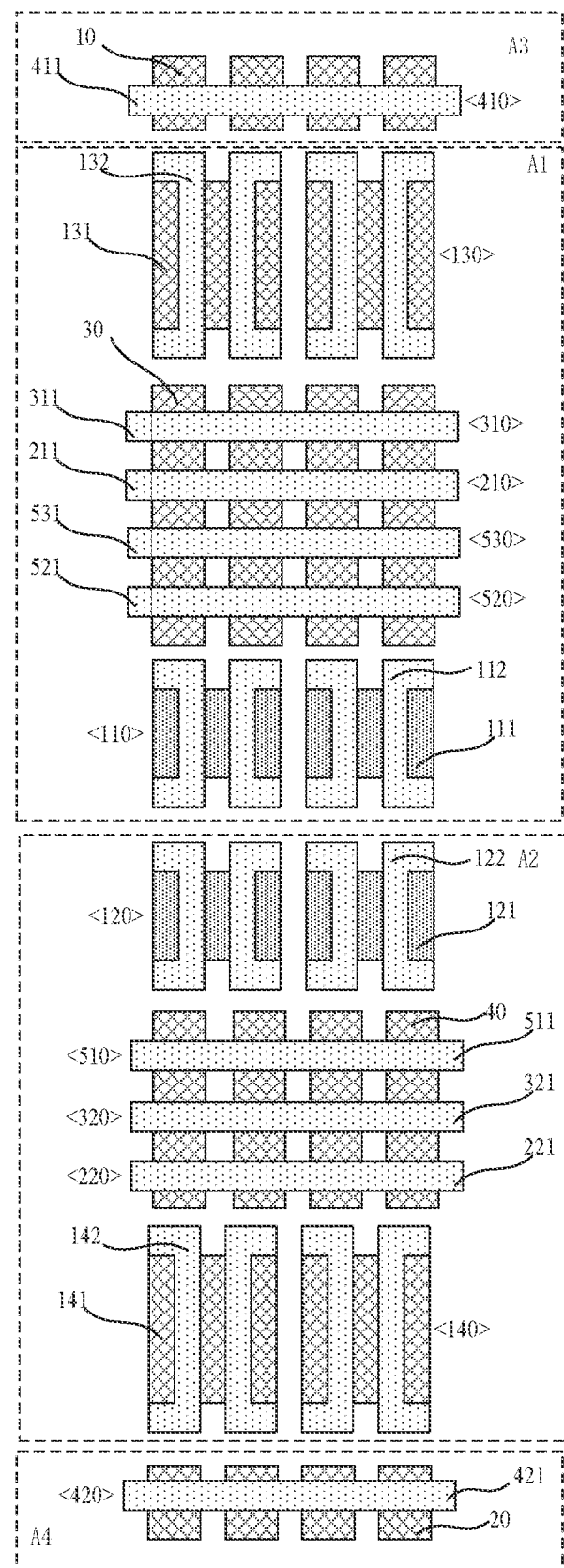
Figure 22:
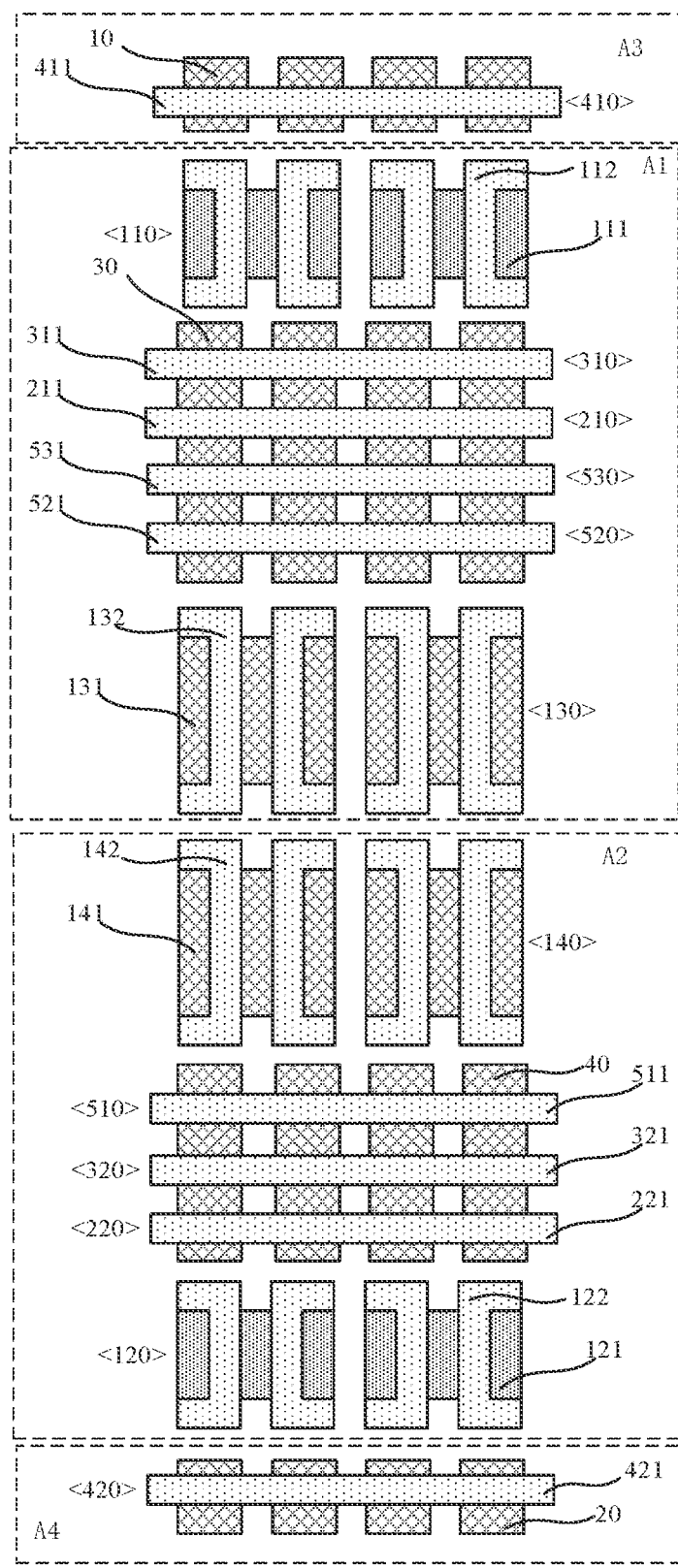

In one embodiment, referring to FIG. 21 or FIG. 22, the first device area A1 further includes the third active layer 30, the first write-back gate layer 311, the first offset-cancellation gate layer 211, the equalization gate layer 531, and the second precharge gate layer 521. Along the direction directing from the first device area A1 to the second device area A2, the first write-back gate layer 311, the first offset-cancellation gate layer 211, the equalization gate layer 531 and the second precharge gate layer 521 are sequentially disposed on the third active layer 30 at intervals.

The third active layer 30 is positioned between the first P-type active layer 111 and the first N-type active layer 131.

The first write-back gate layer 311 is configured to form the first write-back subcircuit 310 together with the third active layer 30. The first offset-cancellation gate layer 211 is configured to form the first offset cancellation subcircuit 210 together with the third active layer 30. The equalization gate layer 531 is configured to form the equalization subcircuit 530 together with the third active layer 30. The second precharge gate layer 511 is configured to form the second precharge subcircuit 510 together with the third active layer 30.

The second device area A2 further includes the fourth active layer 40, the second offset-cancellation gate layer 221, the second write-back gate layer 321, and the first precharge gate layer 511. Along the direction directing from the second device area A2 to the first device area A1, the second offset-cancellation gate layer 221, the second write-back gate layer 321 and the first precharge gate layer 511 are sequentially disposed on the fourth active layer 40 at intervals.

The fourth active layer 40 is positioned between the second P-type active layer 121 and the second N-type active layer 141. The second offset-cancellation gate layer 221 is configured to form the second offset cancellation subcircuit 220 together with the fourth active layer 40. The second write-back gate layer 321 is configured to form the second write-back subcircuit 320 together with the fourth active layer 40. The first precharge gate layer 511 is configured to form the first precharge subcircuit 510 together with the fourth active layer 40.

Figure 23:
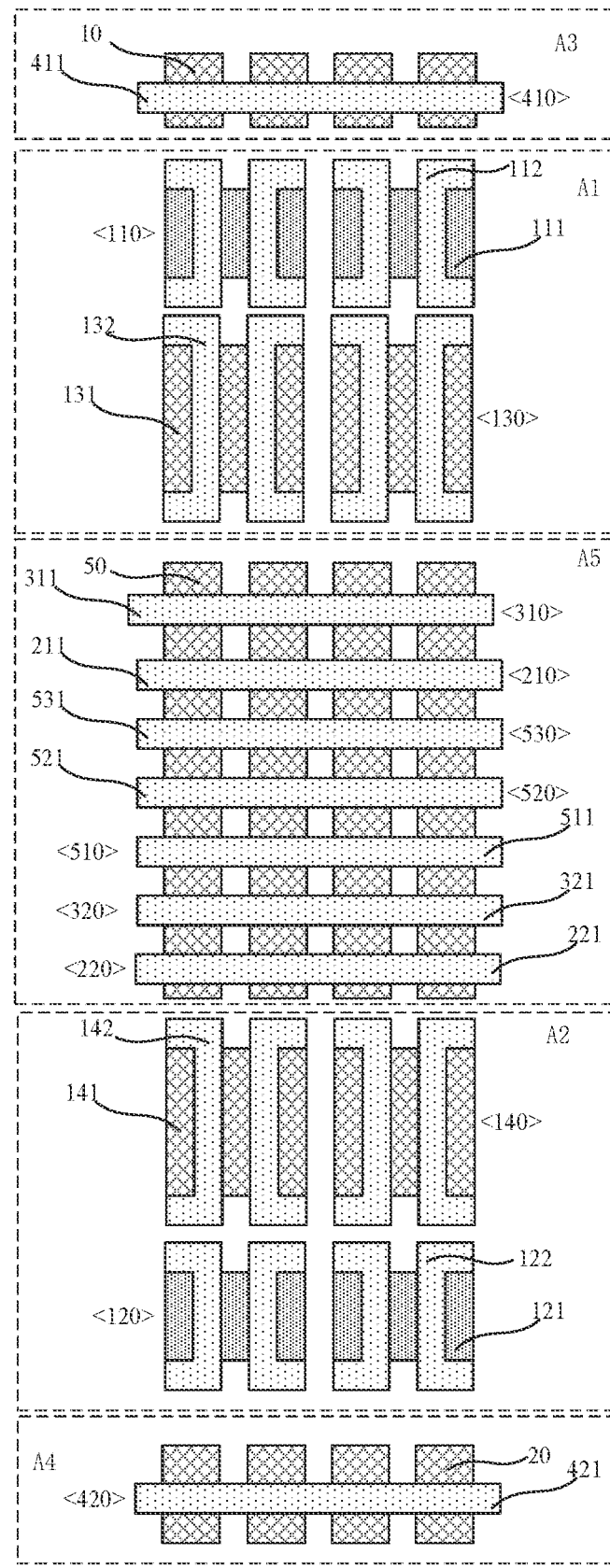
Figure 24:
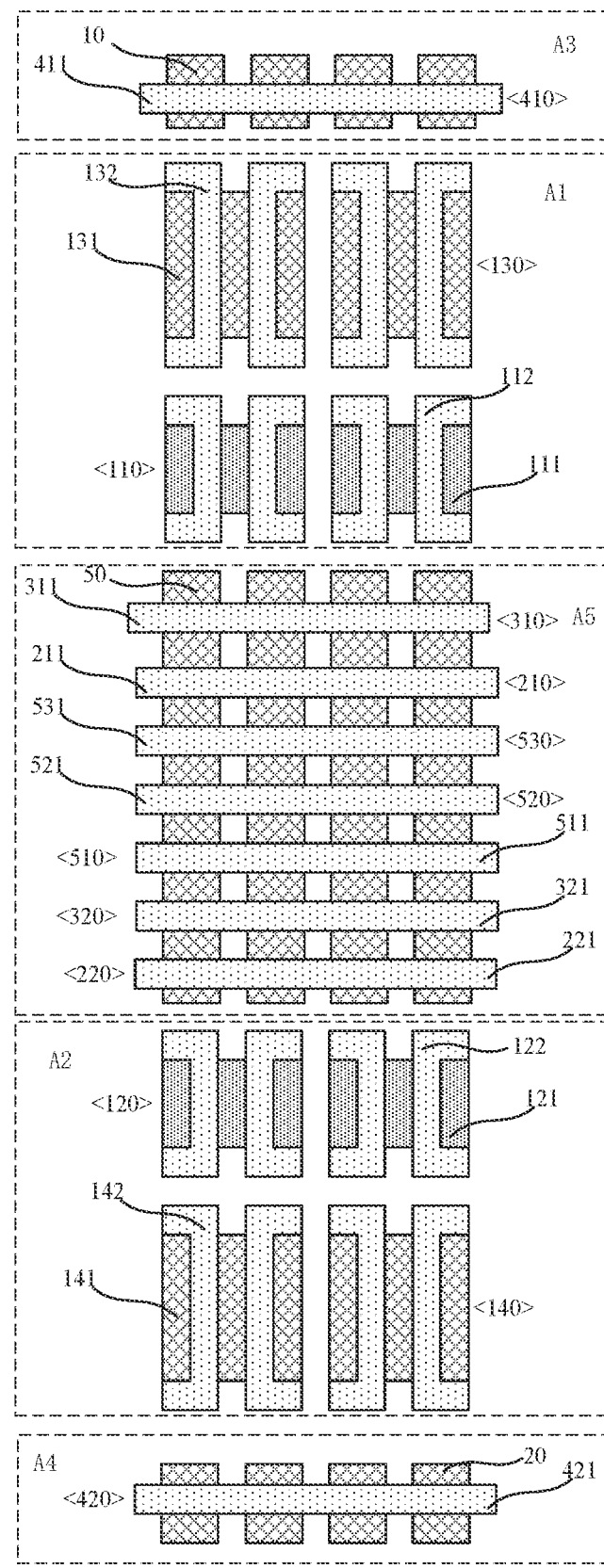

In one embodiment, referring to FIG. 23 or FIG. 24, the layout of the sense amplifier circuit also has a fifth device area A5. The fifth device area A5 is positioned between the first device area A1 and the second device area A2. The fifth device area A5 includes the fifth active layer 50, the first write-back gate layer 311, the first offset-cancellation gate layer 211, the equalization gate layer 531, the second precharge gate layer 521, the first precharge gate layer 511, the second write-back gate layer 321, and the second offset-cancellation gate layer 221. Along the direction directing from the first device area A1 to the second device area A2, the first write-back gate layer 311, the first offset-cancellation gate layer 211, the equalization gate layer 531, the second precharge gate layer 521, the first precharge gate layer 511, the second write-back gate layer 321 and the second offset-cancellation gate layer 221 are sequentially disposed on the fifth active layer 50 at intervals.

The first offset-cancellation gate layer 211 is configured to form the first offset cancellation subcircuit 210 together with the fifth active layer 50. The first write-back gate layer 311 is configured to form the first write-back subcircuit 310 together with the fifth active layer 50. The equalization gate layer 531 is configured to form the equalization subcircuit 530 together with the fifth active layer 50. The first precharge gate layer 511 is configured to form the first precharge subcircuit 510 together with the fifth active layer 50. The second precharge gate layer 521 is configured to form the second precharge subcircuit 520 together with the fifth active layer 50. The second write-back gate layer 321 is configured to form the second write-back subcircuit 320 together with the fifth active layer 50. The second offset-cancellation gate layer 221 is configured to form the second offset cancellation subcircuit 220 together with the fifth active layer 50.

Figure 25:
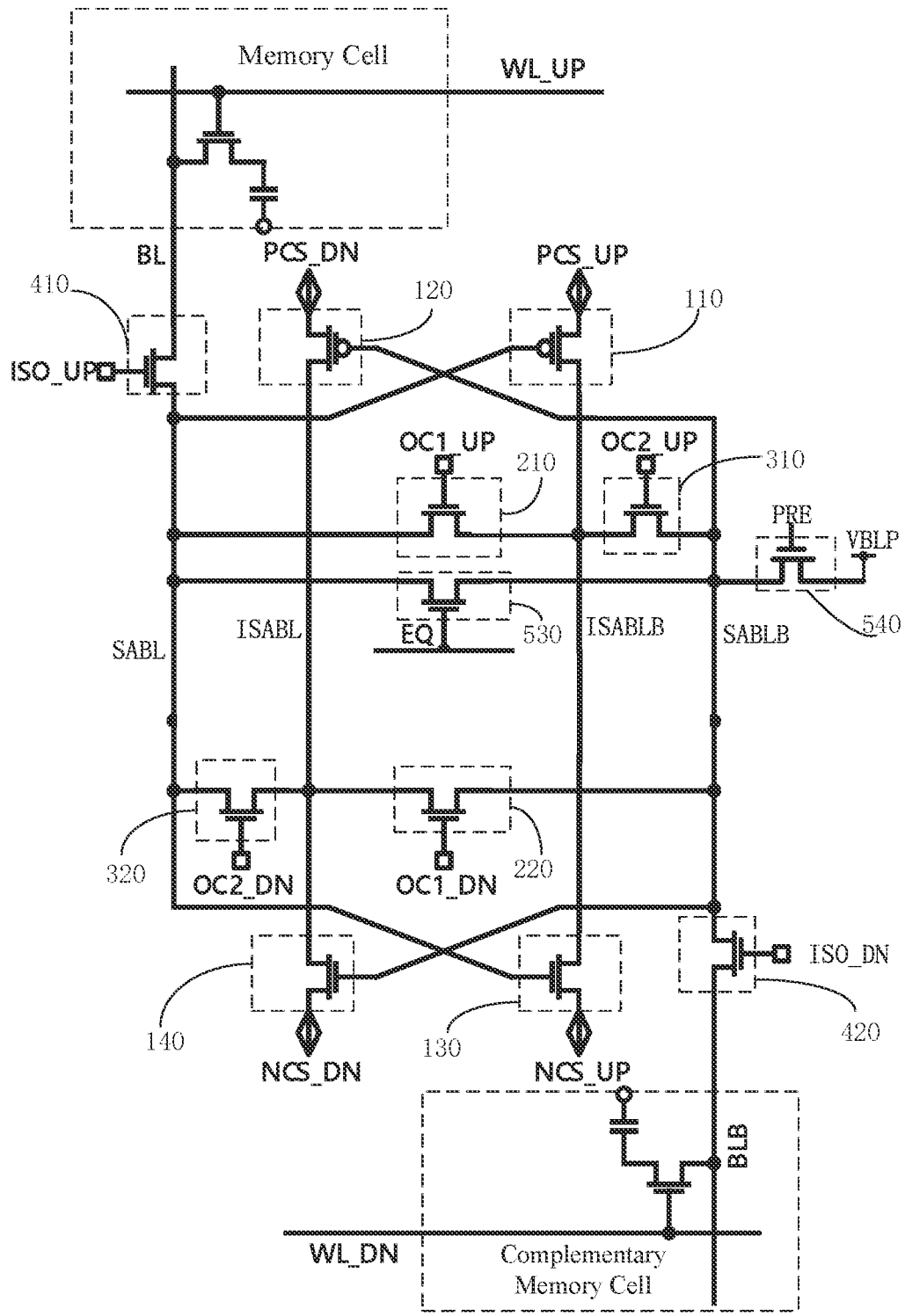
FIG. 25 is a schematic circuit diagram of a sense amplifier circuit provided in yet another embodiment.

In one embodiment, referring to FIG. 25, the sense amplifier circuit further includes a third precharge subcircuit 540 and the equalization subcircuit 530. The third precharge subcircuit 540 is configured to connect the first complementary read bit line SABLB or the first read bit line SABL to the precharge signal terminal in response to the precharge signal PRE. The equalization subcircuit 520 is configured to connect the first read bit line SABL to the first complementary read bit line SABLB in response to the equalization signal EQ.

At this moment, in the precharge stage, the precharge signal PRE may be provided to turn on the third precharge subcircuit 540 to precharge the first complementary read bit line SABLB or the first read bit line SABL.

Here, reference is made by taking an example where the third precharge subcircuit 540 is turned on to precharge the first complementary read bit line SABLB. When the third precharge subcircuit 540 is turned on, the equalization signal EQ is provided, such that the equalization subcircuit 530 is turned on. At this moment, the first read bit line SABL is connected to the first complementary read bit line SABLB, such that the first read bit line SABL is precharged simultaneously when the first complementary read bit line SABLB is precharged, and the first read bit line SABL and the first complementary read bit line SABLB achieve voltage equilibrium.

In this embodiment, only one third precharge subcircuit 540 is provided, such that the circuit structure is effectively simplified.

In one embodiment, the third precharge subcircuit 540 includes a third precharge transistor. There may be one or more third precharge transistors in the third precharge subcircuit 540.

A gate of the third precharge transistor is configured to receive the precharge signal, a source of the third precharge transistor is connected to one of the first read bit line SABL and the precharge signal terminal, and a drain of the third precharge transistor is connected to other one of the first read bit line SABL and the precharge signal terminal.

In some embodiments, the gate of the third precharge transistor is configured to receive the precharge signal, the source of the third precharge transistor is connected to one of the first complementary read bit line SABLB and the precharge signal terminal, and the drain of the third precharge transistor is connected to other one of the first complementary read bit line SABLB and the precharge signal terminal.

The equalization subcircuit 530 includes an equalization transistor. A gate of the equalization transistor is configured to receive the equalization signal EQ. A source of the equalization transistor is connected to one of the first read bit line SABL and the first complementary read bit line SABLB, and the drain of the first isolation transistor is connected to other one of the first read bit line SABL and the first complementary read bit line SABL.

In one embodiment, the gate of the third precharge transistor and the gate of the equalization transistor are connected to the same control terminal, such that the precharge signal PRE and the equalization signal EQ may be simultaneously obtained by means of the control terminal. In this case, circuit control may be simplified.

Of course, in other embodiments, the gate of the third precharge transistor and the gate of the equalization transistor 530 may also be connected to different control terminals, which is not limited herein.

In one embodiment, referring to FIG. 26 or FIG. 27 or FIG. 28 or FIG. 29, the third device area A3 further includes the first offset-cancellation gate layer 211, the first write-back gate layer 311 and third precharge gate layer 541 arranged on the first active layer 10.

Along the direction directing from the third device area A3 to the first device area A1, the third device area A3 includes the first isolation gate layer 411, the first offset-cancellation gate layer 211, the first write-back gate layer 311 and the third precharge gate layer 541 sequentially arranged on the first active layer 10 at intervals. The first offset-cancellation gate layer 211 is configured to form the first offset cancellation subcircuit 210 together with the first active layer 10. The first write-back gate layer 311 is configured to form the first write-back subcircuit 310 together with the first active layer 10. The first precharge gate layer is configured to form the third precharge subcircuit 540 together with the first active layer 10.

The fourth device area A4 further includes the second offset-cancellation gate layer 221, the second write-back gate layer 321 and the equalization gate layer 531 disposed on the second active layer 20.

Figure 26:
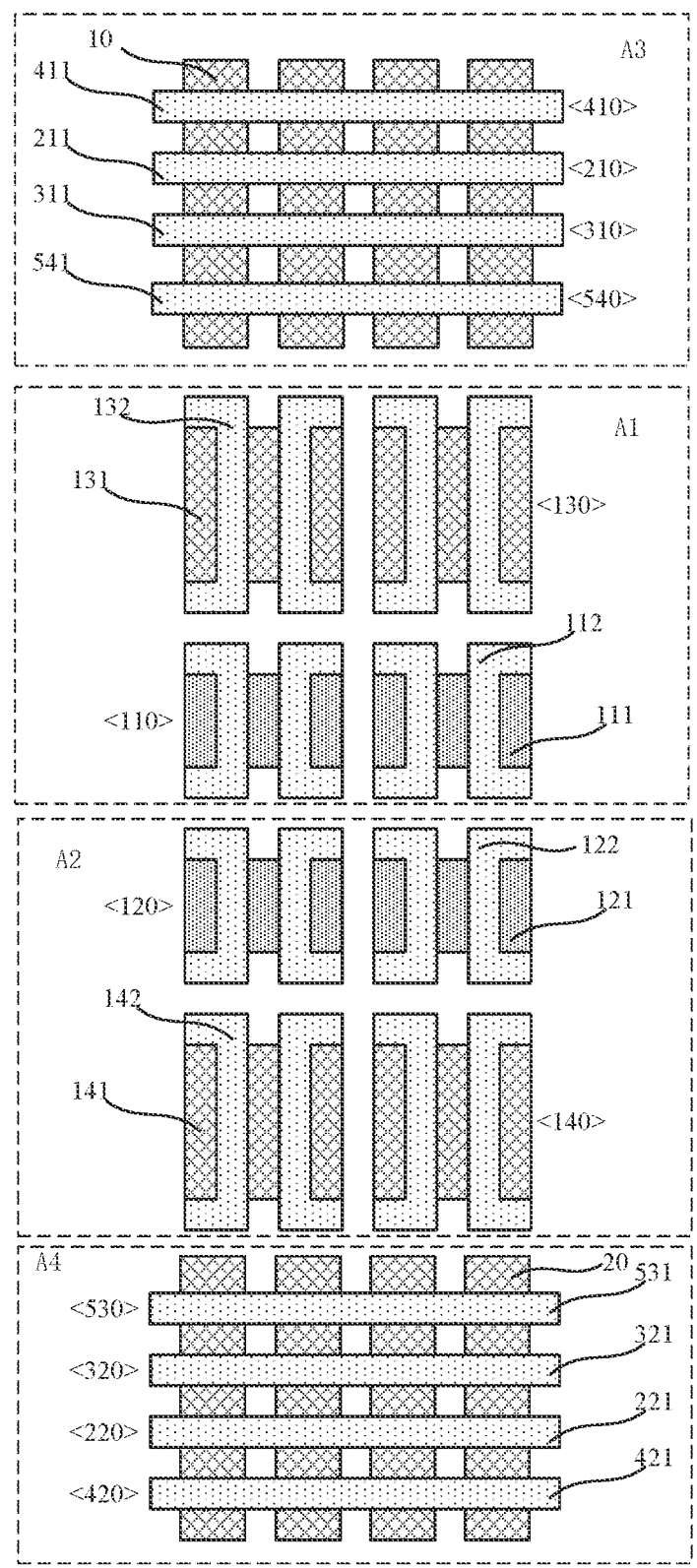
FIGS. 26 to 37 are schematic structural diagrams corresponding to the schematic circuit diagram of the sense amplifier circuit shown in FIG. 25 in different embodiments.
Figure 27:
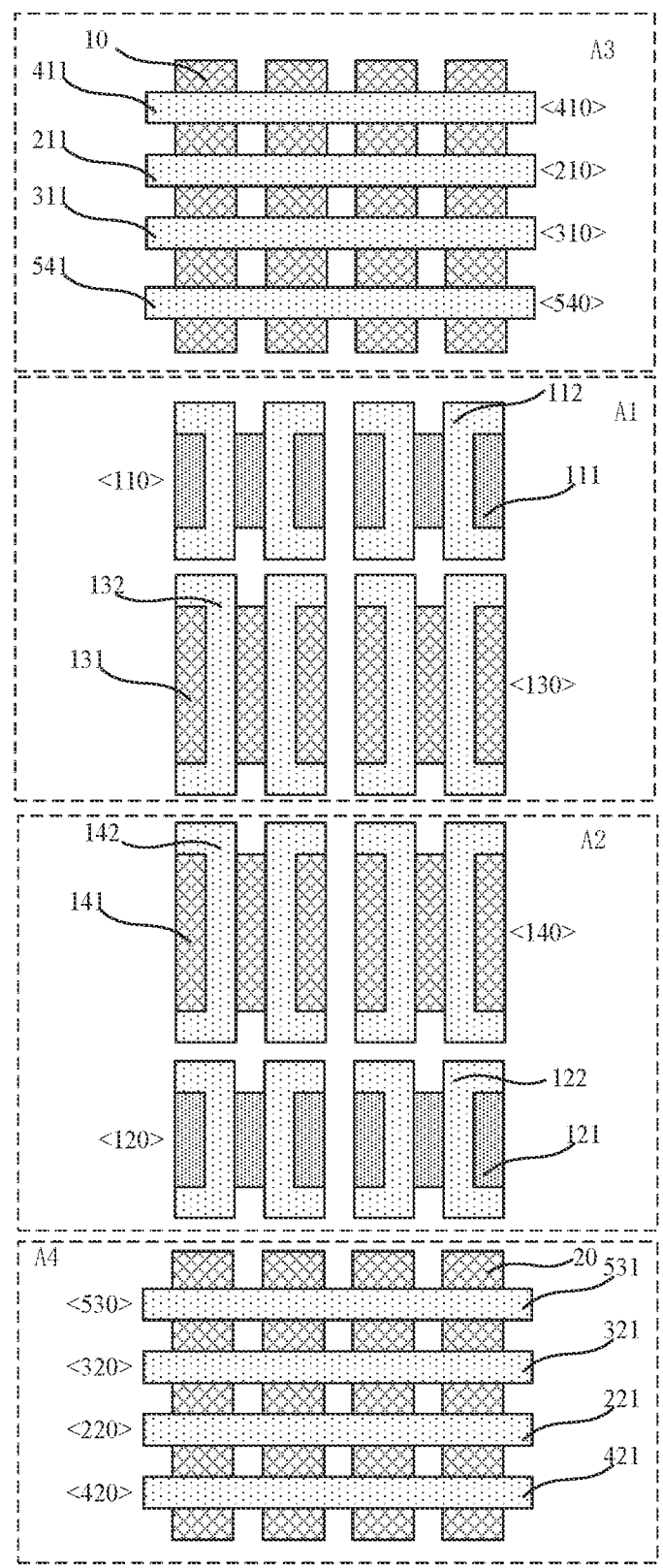

Referring to FIG. 26 or FIG. 27, along the direction directing from the fourth device area A4 to the second device area A2, the fourth device area A4 includes the second isolation gate layer 421, the second offset-cancellation gate layer 221, the second write-back gate layers 321 and the equalization gate layer 531 sequentially arranged at intervals on the second active layer 20.

Figure 28:
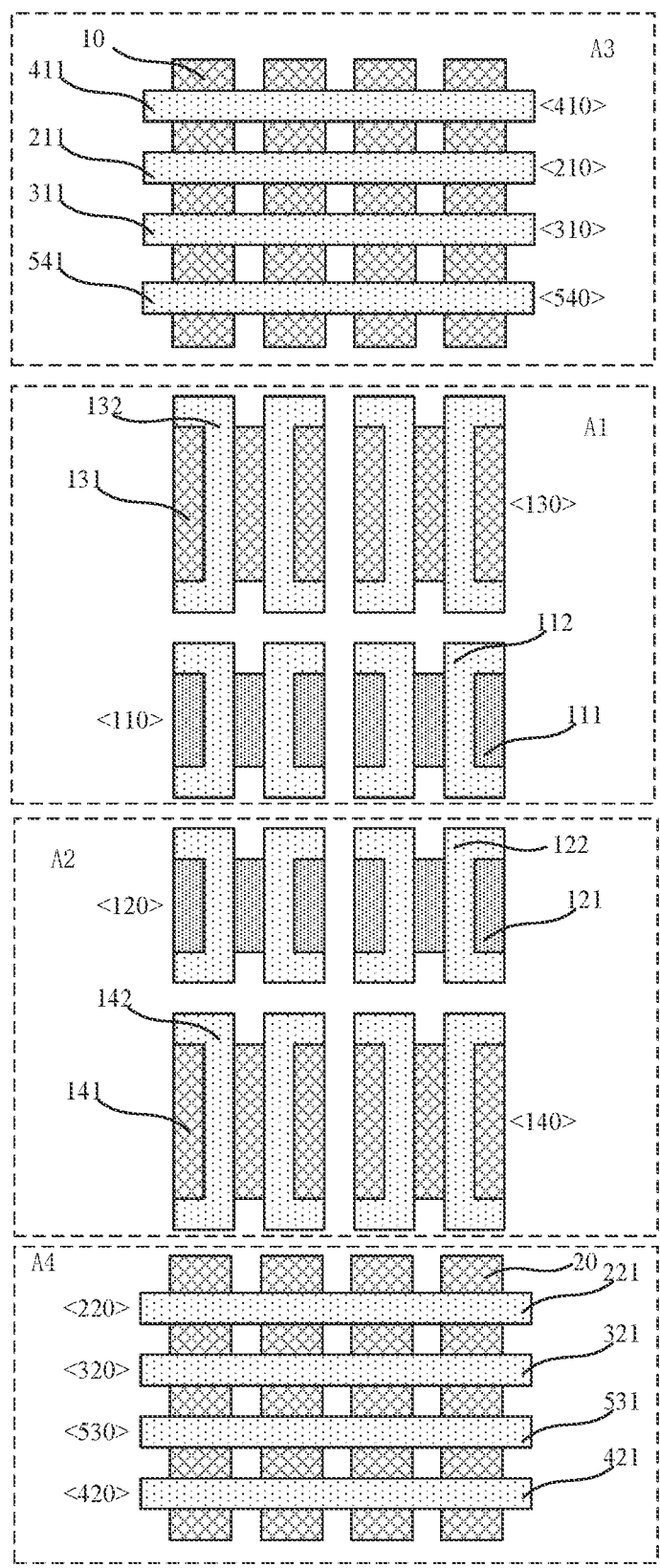
Figure 29:
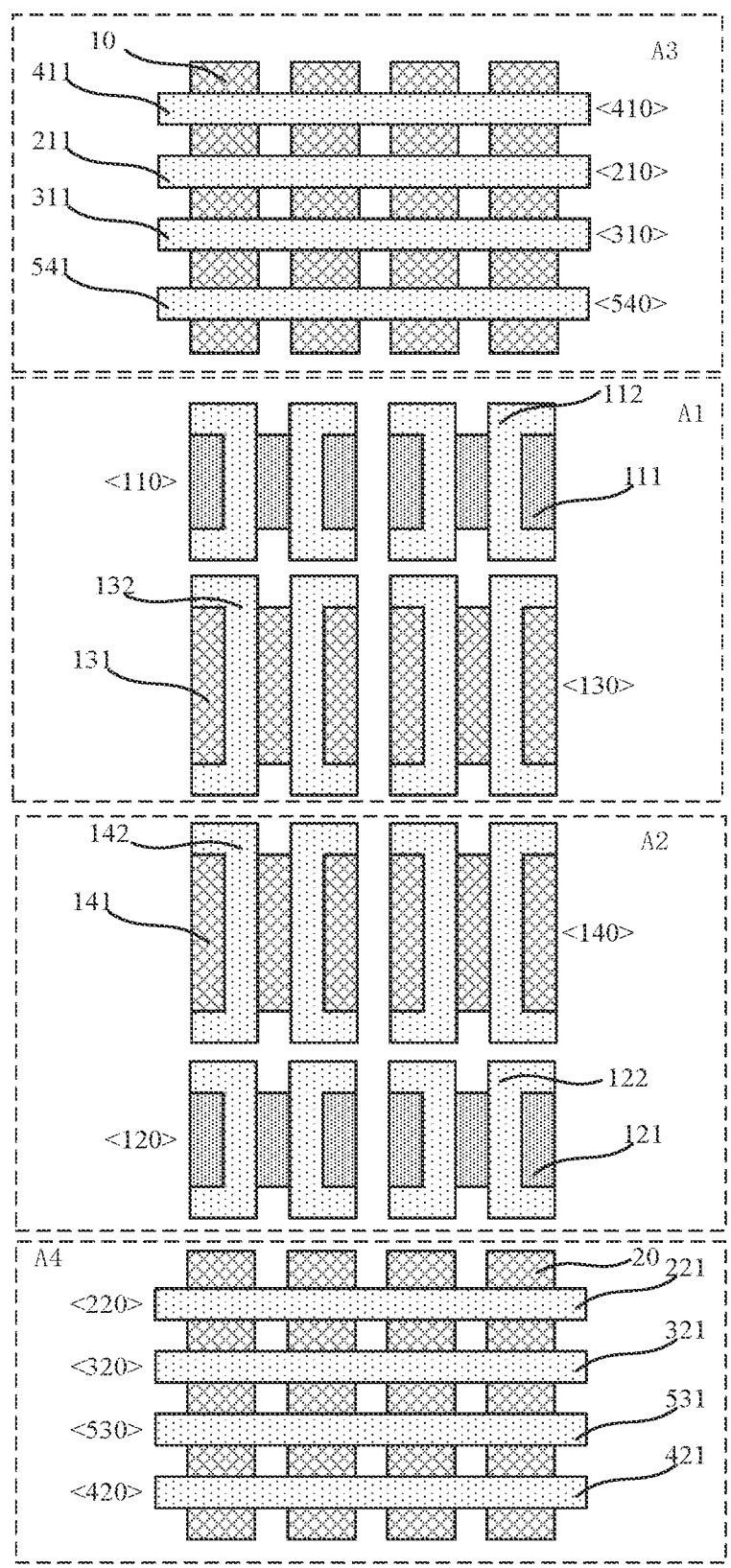

Referring to FIG. 28 or FIG. 29, along the direction directing from the fourth device area A4 to the second device area A2, the fourth device area A4 includes the second isolation gate layer 421, the equalization gate layer 531, the second write-back gate layer 321 and the second offset-cancellation gate layer 221 sequentially arranged at intervals on the second active layer 20.

The second offset-cancellation gate layer 221 is configured to form the second offset cancellation subcircuit 220 together with the second active layer 20. The second write-back gate layer 321 is configured to form the second write-back subcircuit 320 together with the second active layer 20. The equalization gate layer 531 is configured to form the equalization subcircuit together with the second active layer 20.

Figure 30:
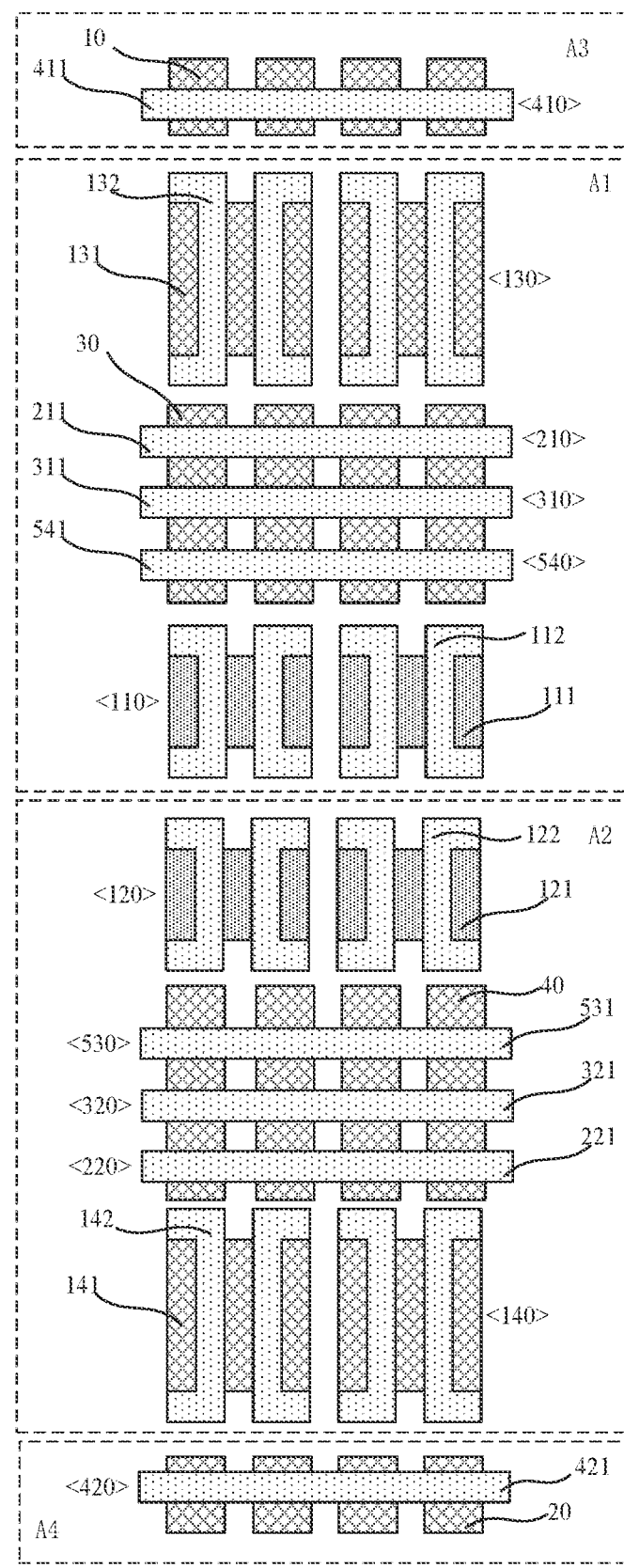
Figure 31:
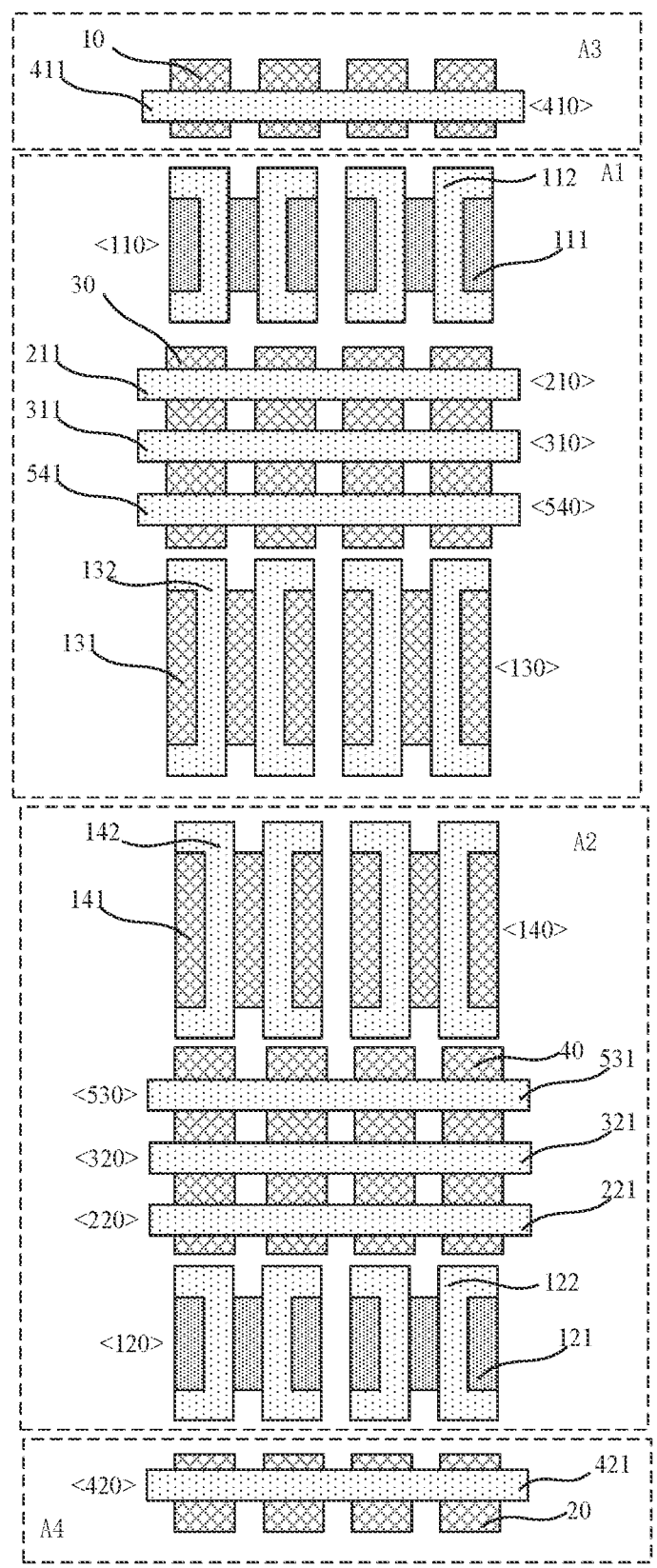
Figure 32:
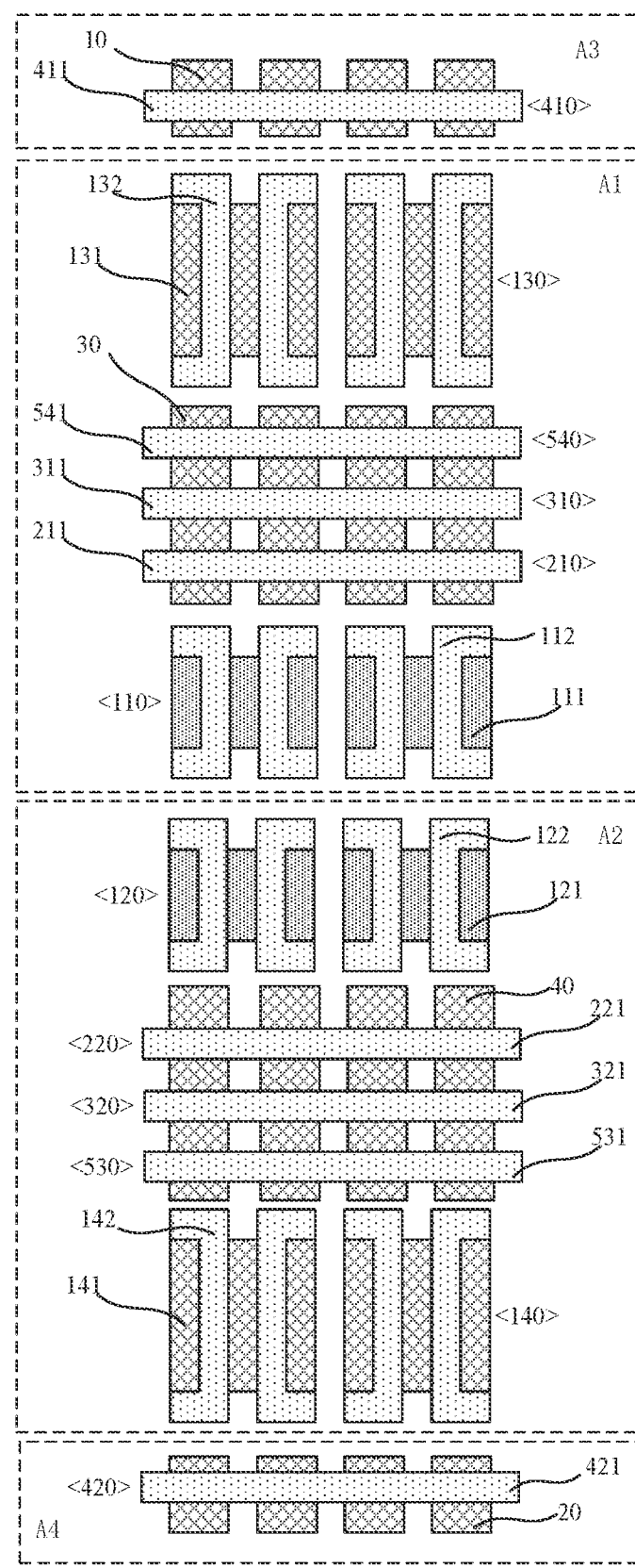
Figure 33:
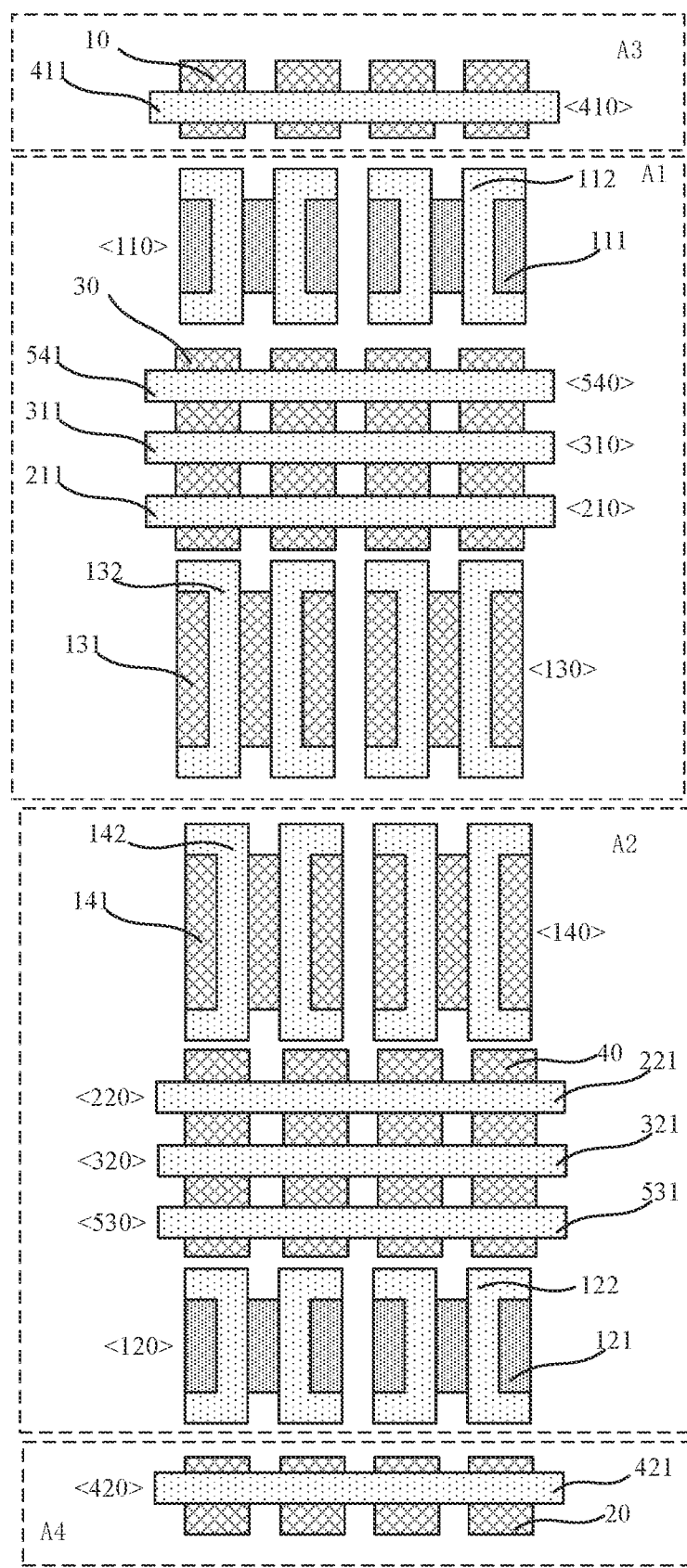

In one embodiment, referring to FIG. 30 or FIG. 31 or FIG. 32 or FIG. 33, the first device area A1 further includes the third active layer 30, the first offset-cancellation gate layer 211, the first write-back gate layer 311, and the third precharge gate layer 541. Referring to FIG. 30 or FIG. 31, along the direction directing from the first device area A1 to the second device area A2, the first offset-cancellation gate layer 211, the first write-back gate layer 311 and the third precharge gate layer 541 are sequentially arranged at intervals on the third active layer 30. Referring to FIG. 32 or FIG. 33, along the direction directing from the first device area A1 to the second device area A2, the third precharge gate layer 541, the first write-back gate layer 311 and the first offset-cancellation gate layer 211 are sequentially arranged at intervals on the third active layer 30.

The third active layer 30 is positioned between the first P-type active layer 111 and the first N-type active layer 131. The first offset-cancellation gate layer 211 is configured to form the first offset cancellation subcircuit 210 together with the third active layer 30. The first write-back gate layer 311 is configured to form the first write-back subcircuit 310 together with the third active layer 30. The third precharge gate layer 541 is configured to form the third precharge subcircuit 540 together with the third active layer 30.

The second device area A2 further includes the fourth active layer 40, the second offset-cancellation gate layer 221, the second write-back gate layer 321, and the equalization gate layer 531. Referring to FIG. 30 or FIG. 31, along the direction directing from the second device area A2 to the first device area A1, the second offset-cancellation gate layer 221, the second write-back gate layer 321 and the equalization gate layer 531 are sequentially arranged at intervals on the fourth active layer 40. Referring to FIG. 32 or FIG. 33, along the direction directing from the second device area A2 to the first device area A1, the equalization gate layer 531, the second write-back gate layer 321 and the second offset-cancellation gate layer 221 are sequentially arranged at intervals on the fourth active layer 40.

The fourth active layer 40 is positioned between the second P-type active layer 121 and the second N-type active layer. The second offset-cancellation gate layer 221 is configured to form the second offset cancellation subcircuit 220 together with the fourth active layer 40. The second write-back gate layer 321 is configured to form the second write-back subcircuit 320 together with the fourth active layer 40. The equalization gate layer 531 is configured to form the equalization subcircuit together with the fourth active layer 40.

In one embodiment, referring to FIG. 34 or FIG. 35 or FIG. 36 or FIG. 37, the first device area A1 further includes the third active layer 30, the first offset-cancellation gate layer 211, the first write-back gate layer 311, and the equalization gate layer 531.

Figure 34:
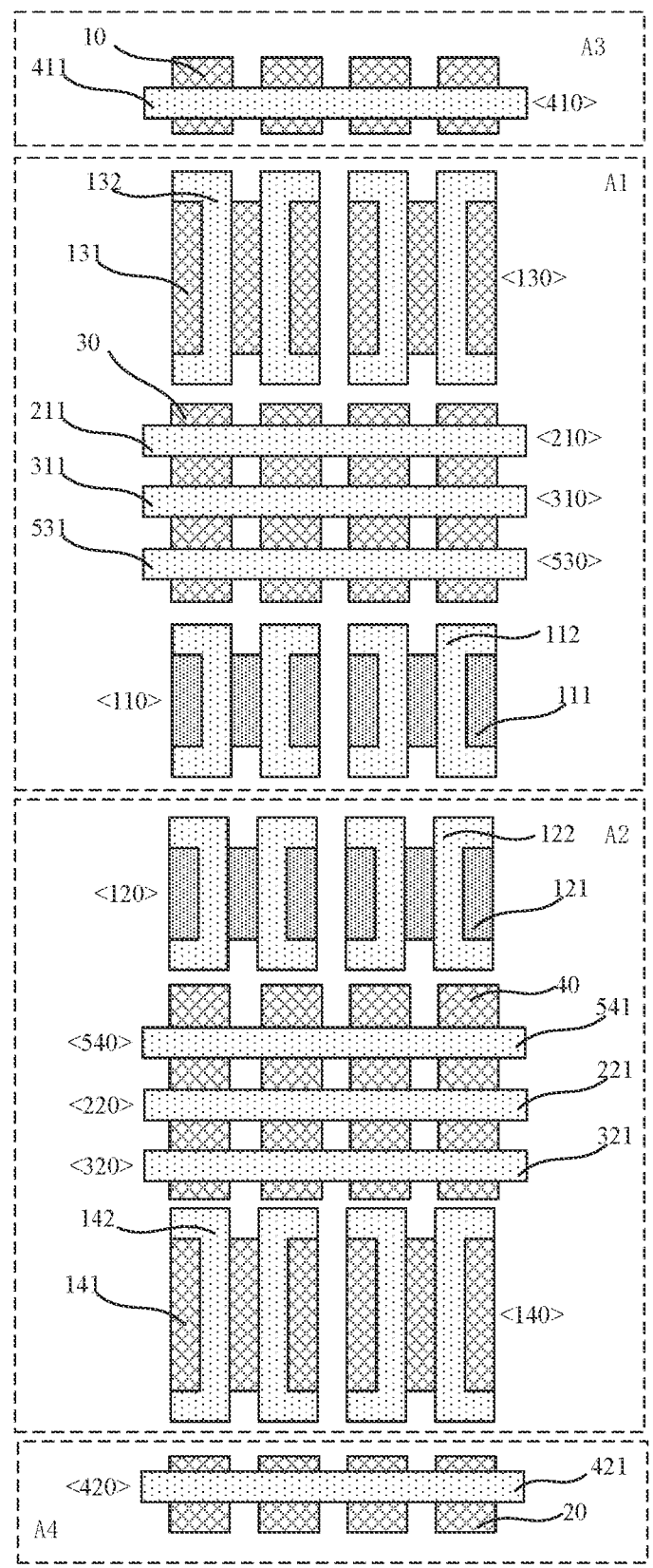
Figure 35:
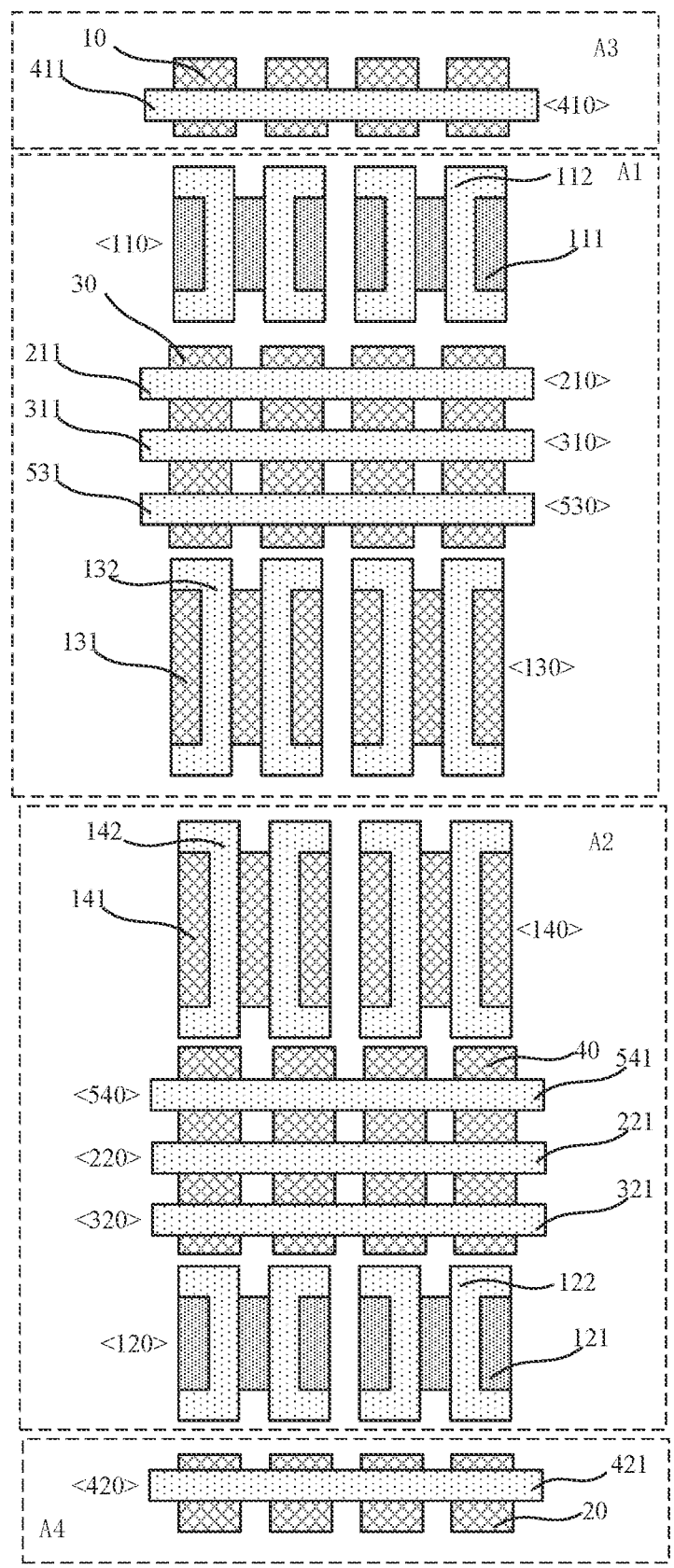

Referring to FIG. 34 or FIG. 35, along the direction directing from the first device area A1 to the second device area A2, the first offset-cancellation gate layer 211, the first write-back gate layer 311 and the equalization gate layer 531 are sequentially arranged at intervals on the third active layer 30.

Figure 36:
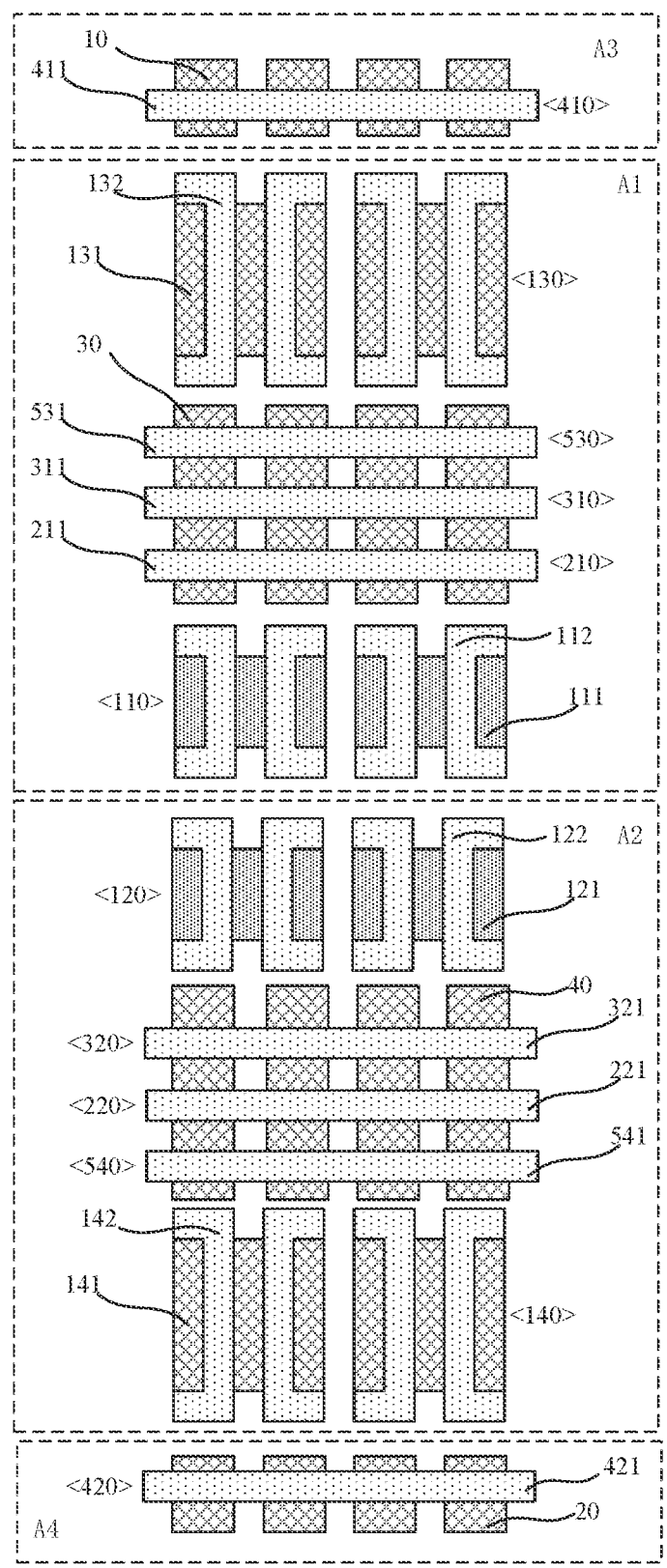
Figure 37:
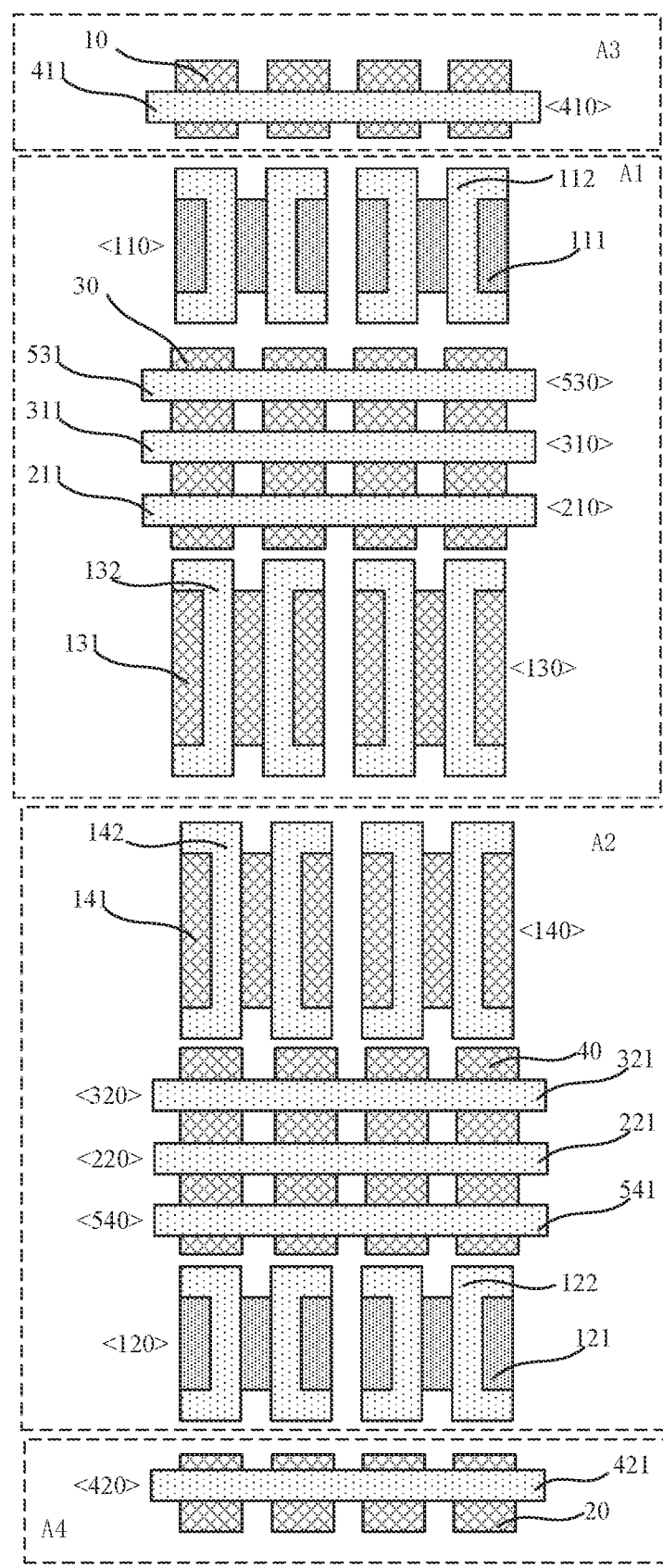

Referring to FIG. 36 or FIG. 37, along the direction directing from the first device area A1 to the second device area A2, the equalization gate layer 531, the first write-back gate layer 311 and the first offset-cancellation gate layer 211 are sequentially arranged at intervals on the third active layer 30.

The third active layer 30 is positioned between the first P-type active layer 111 and the first N-type active layer 131. The first offset-cancellation gate layer 211 is configured to form the first offset cancellation subcircuit 210 together with the third active layer 30. The first write-back gate layer 311 is configured to form the first write-back subcircuit 310 together with the third active layer 30. The equalization gate layer 531 is configured to form the equalization subcircuit together with the third active layer 30.

The second device area further includes the fourth active layer 40, the second offset-cancellation gate layer 221, the second write-back gate layer 321, and the third precharge gate layer 541. The second offset-cancellation gate layer 221, the second write-back gate layer 321 and the third precharge gate layer 541 are disposed on the fourth active layer 40.

Referring to FIG. 34 or FIG. 35, along the direction directing from the first device area A1 to the second device area A2, the third precharge gate layer 541, the second offset-cancellation gate layer 221 and the second write-back gate layer 321 are sequentially arranged at intervals on the fourth active layer 40.

Referring to FIG. 36 or FIG. 37, along the direction directing from the first device area A1 to the second device area A2, the second write-back gate layer 321, the second offset-cancellation gate layer 221 and the third precharge gate layer 541 are sequentially arranged at intervals on the fourth active layer 40.

The fourth active layer 40 is positioned between the second P-type active layer 121 and the second N-type active layer 141. The second offset-cancellation gate layer 221 is configured to form the second offset cancellation subcircuit 220 together with the fourth active layer 40. The second write-back gate layer 321 is configured to form the second write-back subcircuit 320 together with the fourth active layer 40. The third precharge gate layer 541 is configured to form the third precharge subcircuit 540 together with the fourth active layer 40.

In one embodiment, the first offset cancellation subcircuit 210 includes a first offset cancellation transistor. There may be one or more first offset cancellation transistors in the first offset cancellation subcircuit 210.

A gate of the first offset cancellation transistor is configured to receive the first offset cancellation signal OC1_UP, a source of the first offset cancellation transistor is connected to one of the first read bit line SABL and the second complementary read bit line ISABLB, and a drain of the first offset cancellation transistor is connected to other one of the first read bit line SABL and the second complementary read bit line ISABLB.

The second offset cancellation subcircuit 220 includes a second offset cancellation transistor. There may be one or more second offset cancellation transistors in the second offset cancellation subcircuit 220.

A gate of the second offset cancellation transistor is configured to receive the second offset cancellation signal OC1_DN, a source of the second offset cancellation transistor is connected to one of the first complementary read bit line SABLB and the second read bit line ISABL, and a drain of the second offset cancellation transistor is connected to other one of the first complementary read bit line SABLB and the second read bit line ISABL.

The first write-back subcircuit 310 includes a first write-back transistor. There may be one or more first write-back transistors in the first write-back subcircuit 310.

A gate of the first write-back transistor is configured to receive the first write-back signal OC2_UP, a source of the first write-back transistor is connected to one of the first complementary read bit line SABLB and the second complementary read bit line ISABLB, and a drain of the first write-back transistor is connected to other one of the first complementary read bit line SABLB and the second complementary read bit line ISABLB.

The second write-back subcircuit 320 includes a second write-back transistor. There may be one or more second write-back transistors in the second write-back subcircuit 320.

A gate of the second write-back transistor is configured to receive the second write-back signal OC2_DN, a source of the second write-back transistor is connected to one of the first read bit line SABL and the second read bit line ISABL, and a drain of the second write-back transistor is connected to other one of the first read bit line SABL and the second read bit line ISABL.

In one embodiment, a data read method is also provided, which includes:

in a precharge stage, precharging the bit line BL, the first read bit line SABL, the complementary bit line BLB, and the first complementary read bit line SABLB;

in an offset cancellation stage, respectively providing a high-level signal and a low-level signal to the first signal terminal and the third signal terminal, and simultaneously turning on the first offset cancellation subcircuit 210, such that the first read bit line SABL is connected to the second complementary read bit line ISABLB;

in a charge sharing stage, turning off the first offset cancellation subcircuit 210, turning on a memory cell, and turning on the first write-back subcircuit 310, such that the first complementary read bit line SABLB is connected to the second complementary read bit line ISABLB; and in an amplification stage, providing a high-level signal to the first signal terminal and the second signal terminal, providing a low-level signal to the third signal terminal and the fourth signal terminal, and turning on the second write-back subcircuit 320 simultaneously, such that the first read bit line SABL is connected to the second read bit line ISABL.

In the description of this specification, reference to the description of the terms "one embodiment", "other embodiments", etc. means that a particular feature, structure, material or feature described in connection with this embodiment or example is included in at least one embodiment or example of the present disclosure. The schematic description of the above terms throughout this specification is not necessarily referring to the same embodiment or example.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express several implementations of the embodiments of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the patent of the present disclosure shall be merely limited by the appended claims.

What is claimed is:

1. A sense amplifier circuit, comprising:
 a first P-type transistor connected between a first signal terminal and a second complementary read bit line, the first P-type transistor having a control terminal connected to a first read bit line connected to a bit line;
 a second P-type transistor connected between a second signal terminal and a second read bit line, the second P-type transistor having a control terminal connected to a first complementary read bit line connected to a complementary bit line;
 a first N-type transistor connected between a third signal terminal and the second complementary read bit line, the first N-type transistor having a control terminal connected to the first read bit line;
 a second N-type transistor connected between a fourth signal terminal and the second read bit line, the second N-type transistor having a control terminal connected to the first complementary read bit line;
 a first offset cancellation subcircuit configured to connect the first read bit line to the second complementary read bit line in response to a first offset cancellation signal;
 a second offset cancellation subcircuit configured to connect the first complementary read bit line to the second read bit line in response to a second offset cancellation signal;

a first write-back subcircuit configured to connect the first complementary read bit line to the second complementary read bit line in response to a first write-back signal; and a second write-back subcircuit configured to connect the first read bit line to the second read bit line in response to a second write-back signal.

2. The sense amplifier circuit according to claim 1, further comprising:
a first isolation cell configured to connect the bit line to the first read bit line in response to a first isolation signal; and
a second isolation cell configured to connect the complementary bit line to the first complementary read bit line in response to a second isolation signal.

3. The sense amplifier circuit according to claim 2, wherein in a layout of the sense amplifier circuit, the first P-type transistor and the first N-type transistor are positioned in a first device area, the second P-type transistor and the second N-type transistor being positioned in a second device area;
wherein the first device area comprises: a first P-type active layer and a first gate layer disposed on the first P-type active layer, the first gate layer being configured to form the first P-type transistor together with the first P-type active layer; and
a first N-type active layer and a third gate layer disposed on the first N-type active layer, the third gate layer being configured to form the first N-type transistor together with the first N-type active layer;
wherein the second device area comprises: a second P-type active layer and a second gate layer disposed on the second P-type active layer, the second gate layer being configured to form the second P-type transistor together with the second P-type active layer; and
a second N-type active layer and a fourth gate layer disposed on the second N-type active layer, the fourth gate layer being configured to form the second N-type transistor together with the second N-type active layer.

4. The sense amplifier circuit according to claim 3, wherein in the layout of the sense amplifier circuit, the first isolation cell is positioned in a third device area, the second isolation cell being positioned in a fourth device area:
wherein the third device area comprises a first active layer and a first isolation gate layer disposed on the first active layer, the first isolation gate layer being configured to form the first isolation cell together with the first active layer;
wherein the fourth device area comprises a second active layer and a second isolation gate layer disposed on the second active layer, the second isolation gate layer being configured to form the second isolation cell together with the second active layer; and
wherein the first device area and the second device area are positioned between the third device area and the fourth device area.

5. The sense amplifier circuit according to claim 4, wherein
the third device area further comprises a first offset-cancellation gate layer and a first write-back gate layer disposed on the first active layer, the first offset-cancellation gate layer being configured to form the first offset cancellation subcircuit together with the first active layer, the first write-back gate layer being configured to form the first write-back subcircuit together with the first active layer; and the fourth device area further comprises a second offset-cancellation gate layer and a second write-back gate layer disposed on the second active layer, the second offset-cancellation gate layer being configured to form the second offset cancellation subcircuit together with the second active layer, and the second write-back gate layer being configured to form the second write-back subcircuit together with the second active layer.

6. The sense amplifier circuit according to claim 4, wherein
the first device area further comprises a third active layer, a first offset-cancellation gate layer and a first write-back gate layer, the first offset-cancellation gate layer and the first write-back gate layer being disposed on the third active layer, the third active layer being positioned between the first P-type active layer and the first N-type active layer, the first offset-cancellation gate layer being configured to form the first offset cancellation subcircuit together with the third active layer, and the first write-back gate layer being configured to form the first write-back subcircuit together with the third active layer; and
the second device area further comprises a fourth active layer, a second offset-cancellation gate layer and a second write-back gate layer, the second offset-cancellation gate layer and the second write-back gate layer being disposed on the fourth active layer, the fourth active layer being positioned between the second P-type active layer and the second N-type active layer, the second offset-cancellation gate layer being configured to form the second offset cancellation subcircuit together with the fourth active layer, and the second write-back gate layer being configured to form the second write-back subcircuit together with the fourth active layer.

7. The sense amplifier circuit according to claim 4, wherein in the layout of the sense amplifier circuit, the second offset cancellation subcircuit, the first offset cancellation subcircuit, the first write-back subcircuit and the second write-back subcircuit are positioned in a fifth device area; and
wherein the fifth device area is positioned between the first device area and the second device area, and the fifth device area comprises a fifth active layer, a first offset-cancellation gate layer, a first write-back gate layer, a second offset-cancellation gate layer and a second write-back gate layer; the first offset-cancellation gate layer, the first write-back gate layer, the second offset-cancellation gate layer and the second write-back gate layer are disposed on the fifth active layer, the first offset-cancellation gate layer being configured to form the first offset cancellation subcircuit together with the fifth active layer, the first write-back gate layer being configured to form the first write-back subcircuit together with the fifth active layer, the second offset-cancellation gate layer being configured to form the second offset cancellation subcircuit together with the fifth active layer, and the second write-back gate layer being configured to form the second write-back subcircuit together with the fifth active layer.

8. The sense amplifier circuit according to claim 2, wherein the first isolation cell comprises at least one first isolation transistor, and the second isolation cell comprises at least one second isolation transistor.

9. The sense amplifier circuit according to claim 2, wherein the sense amplifier circuit further comprises:

a first precharge subcircuit configured to connect the first read bit line to a precharge signal terminal in response to a precharge signal;

a second precharge subcircuit configured to connect the first complementary read bit line to the precharge signal terminal in response to the precharge signal; and an equalization subcircuit configured to connect the first read bit line to the first complementary read bit line in response to an equalization signal.

10. The sense amplifier circuit according to claim 9, wherein the first precharge subcircuit comprises at least one first precharge transistor, the second precharge subcircuit comprises at least one second precharge transistor, and the equalization subcircuit comprises at least one equalization transistor.

11. The sense amplifier circuit according to claim 10, wherein a gate of the first precharge transistor, a gate of the second precharge transistor and a gate of the equalization transistor are connected to the same control terminal.

12. The sense amplifier circuit according to claim 2, wherein the sense amplifier circuit further comprises:

a third precharge subcircuit configured to connect the first complementary read bit line or the first read bit line to a precharge signal terminal in response to a precharge signal; and an equalization subcircuit configured to connect the first read bit line to the first complementary read bit line in response to an equalization signal.

13. The sense amplifier circuit according to claim 12, wherein the third precharge subcircuit comprises at least one third precharge transistor, and the equalization subcircuit comprises at least one equalization transistor.

14. The sense amplifier circuit according to claim 13, wherein a gate of the third precharge transistor and a gate of the equalization transistor are connected to the same control terminal.

15. The sense amplifier circuit according to claim 1, wherein the first offset cancellation subcircuit comprises at least one first offset cancellation transistor, the second offset cancellation subcircuit comprises at least one second offset cancellation transistor, the first write-back subcircuit comprises at least one first write-back transistor, and the second write-back subcircuit comprises at least one second write-back transistor.

16. A data read method, applied to the sense amplifier circuit according to claim 1, the data read method comprising:

in a precharge stage, precharging the bit line, the first read bit line, the complementary bit line, and the first complementary read bit line;

in an offset cancellation stage, respectively providing a high-level signal and a low-level signal to the first signal terminal and the third signal terminal, and simultaneously turning on the first offset cancellation subcircuit, such that the first read bit line is connected to the second complementary read bit line;

in a charge sharing stage, turning off the first offset cancellation subcircuit, turning on a memory cell, and turning on the first write-back subcircuit, such that the first complementary read bit line is connected to the second complementary read bit line; and in an amplification stage, providing a high-level signal to the first signal terminal and the second signal terminal, providing a low-level signal to the third signal terminal and the fourth signal terminal, and turning on the second write-back subcircuit simultaneously, such that the first read bit line is connected to the second read bit line.

* * * * *